(12) United States Patent
Lee et al.

(10) Patent No.: US 11,456,314 B2
(45) Date of Patent: Sep. 27, 2022

(54) SEMICONDUCTOR DEVICE INCLUDING TRANSPARENT CONDUCTIVE OXIDE LAYER

(71) Applicant: Samsung Electronics Co., Ltd., Suwon-si (KR)

(72) Inventors: Changsoo Lee, Seoul (KR); Jongmyeong Lee, Hanam-si (KR); Iksoo Kim, Yongin-si (KR); Jiwoon Im, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/882,829

(22) Filed: May 26, 2020

(65) Prior Publication Data

US 2021/0104538 A1    Apr. 8, 2021

(30) Foreign Application Priority Data

Oct. 4, 2019 (KR) .......................... 10-2019-0123150

(51) Int. Cl.
| | |
|---|---|
| *H01L 27/1157* | (2017.01) |
| *H01L 29/792* | (2006.01) |
| *H01L 21/02* | (2006.01) |
| *H01L 27/11582* | (2017.01) |
| *H01L 27/11565* | (2017.01) |
| *H01L 27/11573* | (2017.01) |
| *G11C 7/18* | (2006.01) |

(52) U.S. Cl.
CPC .......... *H01L 27/11582* (2013.01); *G11C 7/18* (2013.01); *H01L 27/1157* (2013.01); *H01L 27/11565* (2013.01); *H01L 27/11573* (2013.01); *H01L 29/7926* (2013.01)

(58) Field of Classification Search
CPC ........................................ H01L 27/115–11597
See application file for complete search history.

(56) References Cited

U.S. PATENT DOCUMENTS

| | | | |
|---|---|---|---|
| 9,035,372 B2 | 5/2015 | Song | |
| 9,159,739 B2 | 10/2015 | Makala et al. | |
| 9,401,211 B2 | 7/2016 | Lee | |
| 9,412,754 B1 * | 8/2016 | Iinuma | .................. H01L 29/456 |
| 9,620,712 B2 | 4/2017 | Hayashi et al. | |

(Continued)

FOREIGN PATENT DOCUMENTS

| | | |
|---|---|---|
| KR | 101016440 B1 | 2/2011 |
| KR | 101263182 B1 | 5/2013 |

*Primary Examiner* — Allen L Parker
*Assistant Examiner* — Gustavo G Ramallo
(74) *Attorney, Agent, or Firm* — Harness, Dickey & Pierce, P.L.C.

(57) ABSTRACT

A semiconductor device may comprise a stack structure on a substrate, the stack structure including a plurality of dielectric layers and a plurality of transparent conductive oxide layers, the dielectric layers and the transparent conductive oxide layers are alternately stacked, each of the dielectric layers and a corresponding one of the transparent conductive oxide layer adjacent to each other in a vertical direction have equal horizontal widths, and a channel structure extending through the stack structure, the channel structure including an information storage layer, a channel layer inside the information storage layer, and a buried dielectric layer inside the channel layer.

18 Claims, 32 Drawing Sheets

(56) References Cited

U.S. PATENT DOCUMENTS

| | | | |
|---|---|---|---|
| 9,768,180 B1 | 9/2017 | Zhou et al. | |
| 10,114,590 B1 | 10/2018 | Wicklein | |
| 10,290,647 B2* | 5/2019 | Noguchi | H01L 21/02211 |
| 10,403,631 B1* | 9/2019 | Lu | H01L 27/11514 |
| 2011/0049592 A1* | 3/2011 | Yoon | H01L 29/6684 |
| | | | 257/295 |
| 2012/0025256 A1* | 2/2012 | Kususe | H01L 33/20 |
| | | | 257/E33.056 |
| 2012/0107987 A1* | 5/2012 | Hur | H01L 33/42 |
| | | | 438/46 |
| 2015/0162342 A1* | 6/2015 | Lee | H01L 29/66833 |
| | | | 257/324 |
| 2015/0214320 A1* | 7/2015 | Liu | H01L 29/7869 |
| | | | 257/43 |
| 2015/0249169 A1* | 9/2015 | Sakai | H01L 31/0376 |
| | | | 438/96 |
| 2016/0079259 A1 | 3/2016 | Son et al. | |
| 2016/0163732 A1 | 6/2016 | Lim et al. | |
| 2018/0337195 A1 | 11/2018 | Jayanti et al. | |
| 2019/0096904 A1* | 3/2019 | Noguchi | H01L 21/31111 |

* cited by examiner

SEMICONDUCTOR DEVICE INCLUDING TRANSPARENT CONDUCTIVE OXIDE LAYER

CROSS-REFERENCE TO RELATED APPLICATION

This application claims from Korean Patent Application No. 10-2019-0123150, filed on Oct. 4, 2019, the disclosure of which is incorporated herein by reference in its entirety.

BACKGROUND

1. Field

Devices consistent with example embodiments relate to semiconductor devices including a transparent conductive oxide layer and semiconductor device manufacturing methods using a transparent conductive oxide layer.

2. Description of Related Art

A nonvolatile memory apparatus including memory cells three-dimensionally arranged for lightweight, thin, short, small, and highly integrated electronic products has been proposed. The nonvolatile memory apparatus includes a channel structure extending through a stack structure. In order to increase the degree of device integration, a higher stack structure may be used, whereby process difficulty may be increased, and misalignment may occur during photolithography or etching.

SUMMARY

Example embodiments of inventive concepts are directed to provide a semiconductor device manufactured through a simplified process and a method of manufacturing the same.

In an embodiment, a semiconductor device may comprise a stack structure on a substrate, the stack structure including a plurality of dielectric layers and a plurality of transparent conductive oxide layers, the dielectric layers and the transparent conductive oxide layers are alternately stacked, each of the dielectric layers and a corresponding one of the transparent conductive oxide layers adjacent to each other in a vertical direction have equal horizontal widths, and a channel structure extending through the stack structure, the channel structure including an information storage layer, a channel layer inside the information storage layer, and a buried dielectric layer inside the channel layer.

According to some example embodiments, a semiconductor device may comprise a peripheral circuit structure including a peripheral circuit device and a contact plug, a lower conductive layer on the peripheral circuit structure, a stack structure on the lower conductive layer, the stack structure including a plurality of dielectric layers and a plurality of transparent conductive oxide layers, the dielectric layers and the transparent conductive oxide layers are alternately stacked, and a plurality of channel structures extending through the stack structure, each channel structure including an information storage layer, a channel layer inside the information storage layer, the channel layer being connected to the lower conductive layer, and a buried dielectric layer inside the channel layer.

According to some example embodiments, a semiconductor device may comprise a peripheral circuit structure comprising a peripheral circuit device and a contact plug; a lower conductive layer on the peripheral circuit structure; a stack structure on the lower conductive layer, the stack structure comprising a plurality of dielectric layers and a plurality of transparent conductive oxide layers, the dielectric layers and the transparent conductive oxide layers are alternately stacked; a plurality of channel structures extending through the stack structure, each channel structure comprising an information storage layer, a channel layer inside the information storage layer, the channel layer being connected to the lower conductive layer, and a buried dielectric layer inside the channel layer; a plurality of conductive pads formed in the stack structure and on respective channel structures; a selection line separation layer extending into the stack structure separating at least one of the transparent conductive oxide layers; a buried layer adjacent to the channel structures, the buried layer extending through the stack structure; and a bit line on the stack structure, the bit line being electrically connected to the conductive pads. When viewed in a longitudinal sectional view, horizontal widths of each of the dielectric layers and a corresponding one of the transparent conductive oxide layers that are stacked adjacent to each other in a vertical direction may be substantially equal to each other. In each of the dielectric layers and the corresponding one of the transparent conductive oxide layers that are stacked adjacent to each other in the vertical direction, a central portion and an edge of the dielectric layer abut the transparent conductive oxide layer, and a horizontal distance between dielectric layers that are adjacent to each other in a horizontal direction, among the dielectric layers, may be substantially equal to a horizontal distance between transparent conductive oxide layers that are adjacent to each other in the horizontal direction, among the transparent conductive oxide layers.

According to some example embodiments, a semiconductor device manufacturing method may comprise alternately stacking a plurality of dielectric layers and a plurality of transparent conductive oxide layers on a substrate to form a stack structure; forming a channel hole so as to extend through the stack structure; forming a lower semiconductor layer in the channel hole so as to protrude from the substrate; and forming a channel structure comprising an information storage layer, a channel layer, and a buried dielectric layer on the lower semiconductor layer.

According to some example embodiments, a semiconductor device manufacturing method may comprise alternately stacking a plurality of dielectric layers and a plurality of transparent conductive oxide layers on a substrate to form a stack structure; forming a channel hole so as to extend through the stack structure; forming an information storage layer at a side surface and a lower surface of the channel hole; etching a lower surface of the information storage layer to form a recess in an upper surface of the substrate; forming a lower semiconductor layer in the channel hole so as to protrude from the substrate; and forming a channel layer and a buried dielectric layer on the lower semiconductor layer.

According to some example embodiments, a semiconductor device manufacturing method may comprise forming a peripheral circuit structure comprising a peripheral circuit device and a contact plug; forming a lower conductive layer on the peripheral circuit structure; alternately stacking a plurality of dielectric layers and a plurality of transparent conductive oxide layers on the lower conductive layer to form a stack structure; forming a channel hole so as to extend through the stack structure; forming an information storage layer at a side surface and a lower surface of the channel hole; etching a lower surface of the information storage layer to form a recess in an upper surface of the lower conductive layer; and forming a channel layer and a buried dielectric layer in the channel hole.

According to some example embodiments, a semiconductor device manufacturing method may comprise sequentially forming a source layer, a sacrificial layer, and a support layer on a substrate; alternately stacking a plurality of dielectric layers and a plurality of transparent conductive oxide layers on the support layer to form a stack structure; forming a channel structure so as to extend through the sacrificial layer, the support layer, the stack structure, and a portion of the source layer; forming a trench so as to be adjacent to the channel structure and to extend through the sacrificial layer, the support layer, and the stack structure; removing the sacrificial layer and forming a conductive line; and removing the transparent conductive oxide layers and forming a plurality of gate electrodes.

BRIEF DESCRIPTION OF THE DRAWINGS

The above and other objects, features, and advantages of inventive concepts will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
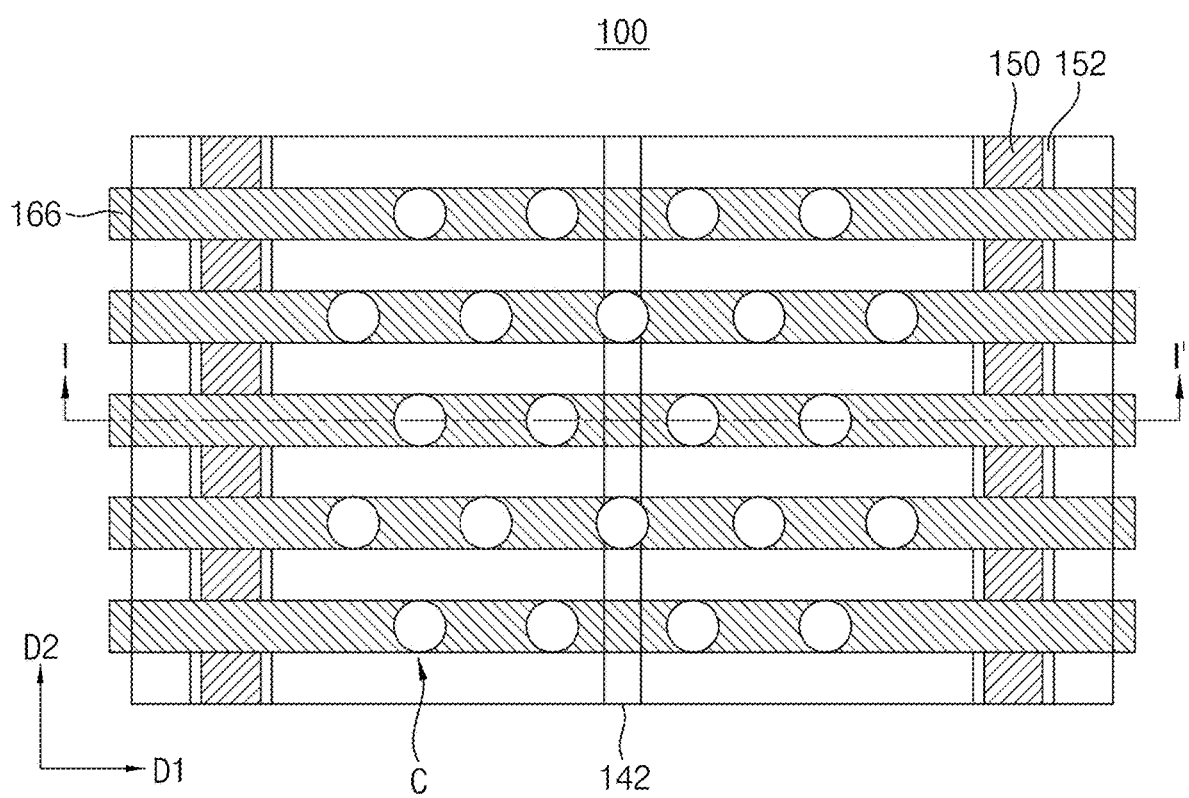
FIG. 1 is a layout of a semiconductor device according to some example embodiments of inventive concepts.
Figure 2:
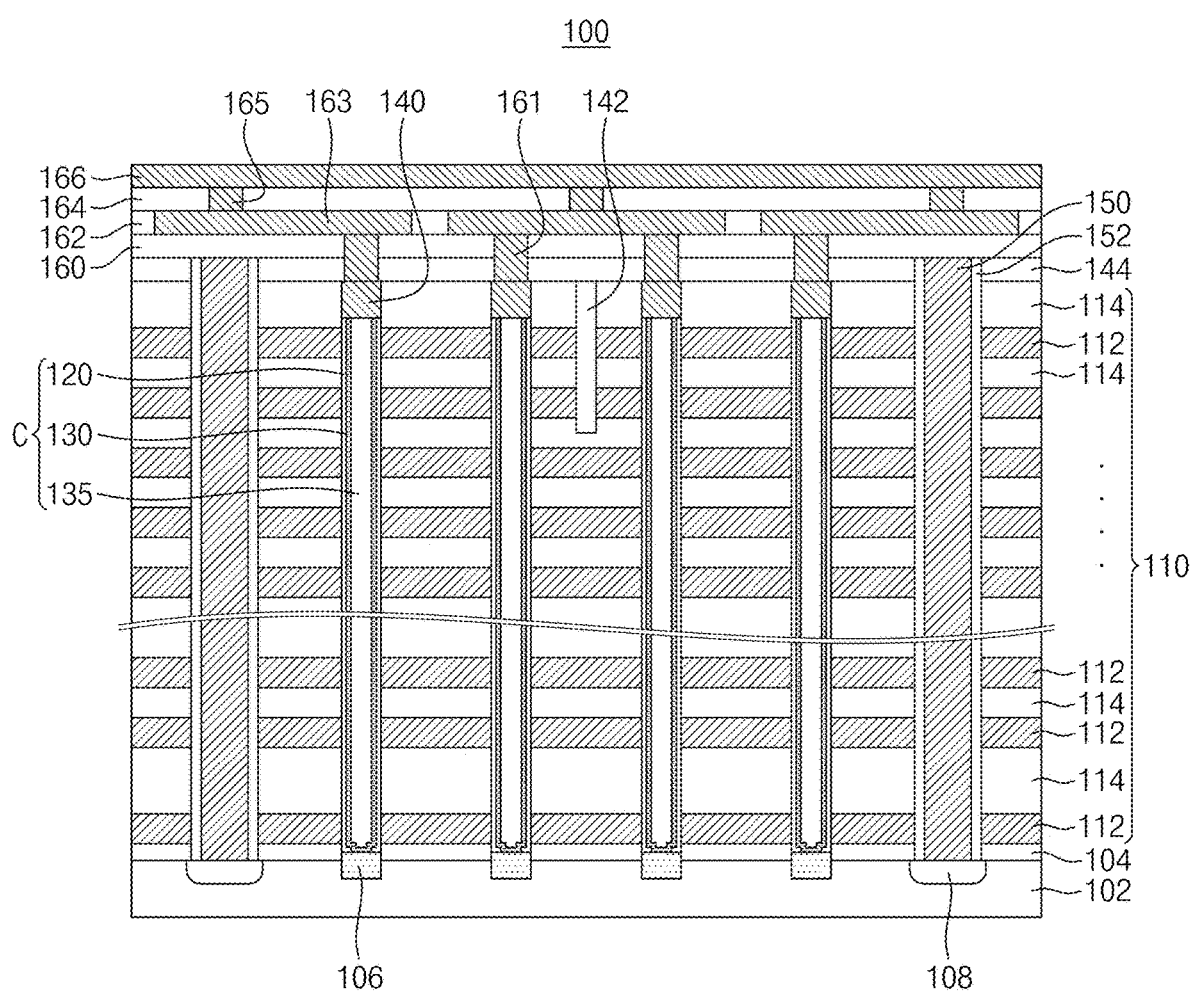
FIG. 2 are vertical cross-sectional views of the semiconductor device of FIG. 1, taken along line I-I'.

FIG. 1 is a layout of a semiconductor device according to some example embodiments of inventive concepts. FIG. 2 are vertical cross-sectional views of the semiconductor device of FIG. 1, taken along line I-I'. A memory apparatus according to embodiments of the present disclosure may include a flash memory, such as VNAND or 3D-NAND.

Referring to FIGS. 1 and 2, a semiconductor device 100 according to the embodiment of the present disclosure may include a substrate 102, a lower dielectric layer 104, a lower semiconductor layer 106, an impurity region 108, a stack structure 110, a channel structure C, a conductive pad 140, and a buried layer 150. The semiconductor device 100 may further include a first upper dielectric layer 160, a sub-bit line plug 161, a second upper dielectric layer 162, a sub-bit line 163, a third upper dielectric layer 164, a bit line plug 165, and a bit line 166.

The substrate 102 may include a semiconductor material. For example, the substrate 102 may be a silicon substrate, a germanium substrate, a silicon germanium substrate, or a silicon-on-insulator (SOI) substrate. In some example embodiments, the substrate 102 may include a group IV semiconductor, a group III-V compound semiconductor, or a group II-VI oxide semiconductor.

The lower dielectric layer 104 may be disposed on the substrate 102. The lower dielectric layer 104 may include a silicon oxide, a silicon nitride, a silicon oxynitride, or a combination thereof. In some example embodiments, the lower dielectric layer 104 may include a silicon oxide.

The lower semiconductor layer 106 may protrude vertically from an upper surface of the substrate 102. The lower semiconductor layer 106 may be an epitaxial layer using the substrate 102 as a seed. The lower semiconductor layer 106 may include silicon, germanium, silicon germanium, a group III-V compound, and/or a group II-VI compound. The impurity region 108 may be disposed at the upper part of the substrate 102. The impurity region 108 may include an n-type impurity.

The stack structure 110 may include a plurality of transparent conductive oxide layers 112 and a plurality of dielectric layers 114. The transparent conductive oxide layers 112 and the dielectric layers 114 may be alternately stacked. At least one of the transparent conductive oxide layers 112 disposed at the lower part of the stack structure 110 may be a ground selection line (GSL). At least one of the transparent conductive oxide layers 112 disposed at the upper part of the stack structure 110 may be a string selection line (SSL) or a drain selection line (DSL).

Each transparent conductive oxide layer 112 may include a metal oxide, such as ZnO, $SnO_2$, $TiO_2$, $CuAlO_2$, $CuGaO_2$, $CuInO_2$, or $SrCu_2O_2$. In some example embodiments, each dielectric layer 114 may include a silicon oxide. In some example embodiments, each transparent conductive oxide layer 112 may have a carrier concentration of $10^{17}/cm^3$ to $10^{22}/cm^3$.

The channel structure C may extend vertically through the stack structure 110. The channel structure C may be electrically connected to the lower semiconductor layer 106. A plurality of channel structures C may be disposed so as to be spaced apart from each other in a first horizontal direction D1. The channel structure C may include an information storage layer 120, a channel layer 130, and a buried dielectric layer 135. The channel layer 130 may be disposed inside the information storage layer 120, and the buried dielectric layer 135 may be disposed inside the channel layer 130. In some example embodiments, in a longitudinal sectional view, the horizontal widths of each dielectric layer 114 and a corresponding transparent conductive oxide layer 112 that are stacked adjacent to each other in a vertical direction may be substantially equal to each other. For example, the difference between the horizontal widths of each dielectric layer 114 and a corresponding transparent conductive oxide layer 112 that are stacked adjacent to each other in the vertical direction may be less than 5 nm. In a longitudinal sectional view, in each dielectric layer 114 and a corresponding transparent conductive oxide layer 112 that are stacked adjacent to each other in the vertical direction, the central portion and the edge of the dielectric layer 114 may abut the transparent conductive oxide layer 112. In a longitudinal sectional view, the horizontal distance between the dielectric layers 114 that are adjacent to each other in a horizontal direction may be substantially equal to the horizontal distance between the transparent conductive oxide layers 112 that are adjacent to each other in the horizontal direction. For example, the horizontal distance between the dielectric layers 114 that are adjacent to each other in the horizontal direction may be equal to the horizontal width of the channel structure C, and the horizontal distance between the transparent conductive oxide layers 112 that are adjacent to each other in the horizontal direction may be equal to the horizontal width of the channel structure C.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

The conductive pad 140 may be disposed on the channel structure C. The conductive pad 140 may be electrically connected to the channel layer 130, and may cover the upper surface of the buried dielectric layer 135.

A selection line separation layer 142 may be disposed at the upper part of the stack structure 110. The selection line separation layer 142 may extend in a second horizontal direction D2, which intersects the first horizontal direction D1. The selection line separation layer 142 may extend through at least one of the transparent conductive oxide layers 112 disposed at the upper part of the stack structure 110. For example, the selection line separation layer 142 may electrically separate the string selection line SSL or the drain selection line DSL.

An interlayer dielectric layer 144 may cover the upper surface of the stack structure 110. Each of the selection line separation layer 142 and the interlayer dielectric layer 144 may include a silicon oxide, a silicon nitride, a silicon oxynitride, or a combination thereof.

The buried layer 150 may extend through the stack structure 110 and the interlayer dielectric layer 144. The buried layer 150 may abut the impurity region 108. The buried layer 150 may extend in the second horizontal direction D2. Side spacers 152 may be disposed at opposite side surfaces of the buried layer 150, and may extend in the second horizontal direction D2. The side spacers 152 may electrically isolate the transparent conductive oxide layers 112 and the buried layer 150.

The first upper dielectric layer 160, the second upper dielectric layer 162, and the third upper dielectric layer 164 may be sequentially stacked on the interlayer dielectric layer 144. The sub-bit line plug 161 may be connected to the conductive pad 140 through the interlayer dielectric layer 144 and the first upper dielectric layer 160. The sub-bit line 163 may be disposed on the first upper dielectric layer 160. The second upper dielectric layer 162 may be disposed at the same level as the sub-bit line 163. The third upper dielectric layer 164 may be disposed at the upper surface of the sub-bit line 163. The bit line plug 165 may be disposed at the same level as the third upper dielectric layer 164, and may be connected to the sub-bit line 163. The bit line 166 may be disposed on the third upper dielectric layer 164, and may extend in the first horizontal direction D1. The bit line 166 may be electrically connected to the channel structure C through the conductive pad 140, the sub-bit line plug 161, the sub-bit line 163, and the bit line plug 165.

Figure 3:
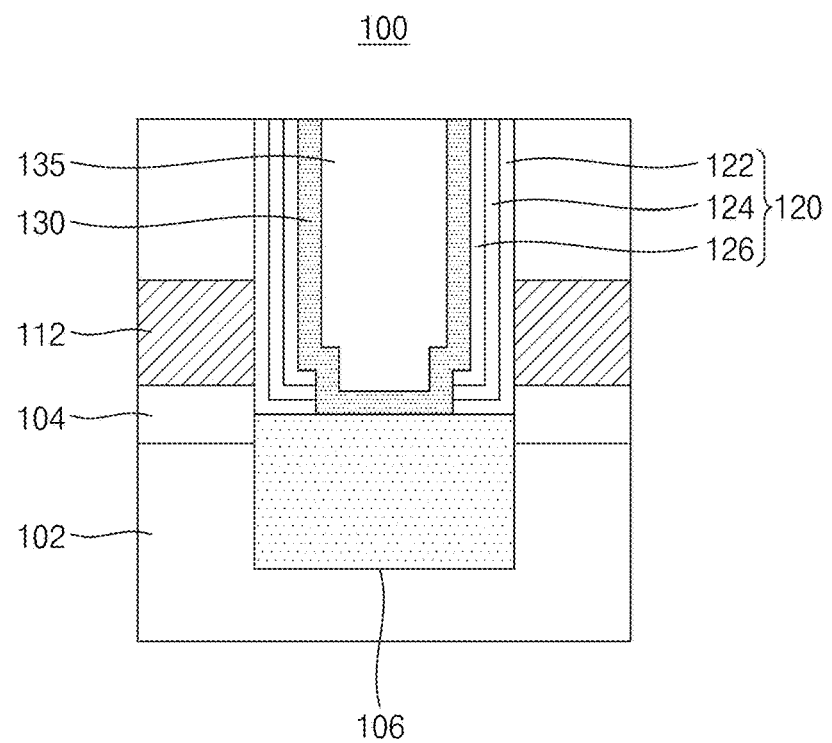
FIG. 3 is a partial enlarged view of the semiconductor device shown in FIG. 2.

FIG. 3 is a partial enlarged view of the semiconductor device shown in FIG. 2.

Referring to FIG. 3, the information storage layer 120 may include a blocking layer 122, a charge storage layer 124, and a tunnel dielectric layer 126. The charge storage layer 124 may be disposed inside the blocking layer 122, and the tunnel dielectric layer 126 may be disposed inside the charge storage layer 124. The side surface of the information storage layer 120 may abut the lowermost one of the transparent conductive oxide layers 112. In some example embodiments, each of the blocking layer 122 and the tunnel dielectric layer 126 may include a silicon oxide, and the charge storage layer 124 may include a silicon nitride.

The lower semiconductor layer 106 may protrude from the upper surface of the substrate 102, and may abut the channel layer 130. The lower surface of the lower semiconductor layer 106 may be located at a lower level than the upper surface of the substrate 102. The upper surface of the lower semiconductor layer 106 may be located at a lower level than the lower surface of the lowermost one of the transparent conductive oxide layers 112. The channel layer 130 may extend through the information storage layer 120, and may abut the upper surface of the lower semiconductor layer 106. The channel layer 130 may be formed conformally along the inner wall of the information storage layer 120 and the upper surface of the lower semiconductor layer 106. However, the present disclosure is not limited thereto.

Figure 4:
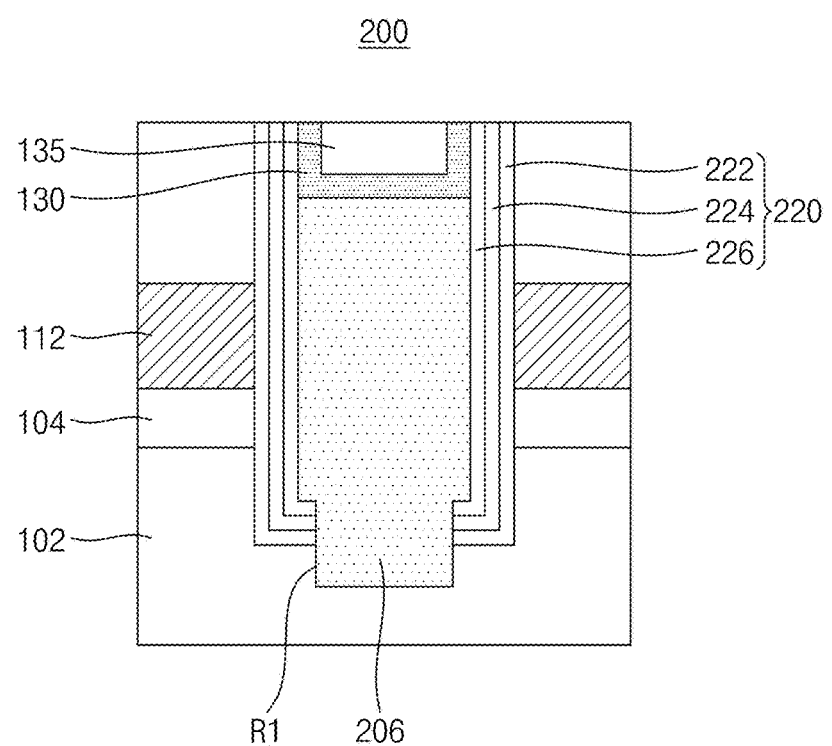
FIG. 4 is a partial enlarged view of the semiconductor device according to some example embodiments of inventive concepts.

FIG. 4 is a partial enlarged view of the semiconductor device according to some example embodiments of inventive concepts.

Referring to FIG. 4, a semiconductor device 200 may include a recess R1 formed in the upper surface of a substrate 102. A lower semiconductor layer 206 may protrude from the upper surface of the substrate 102, and may abut a channel layer 130. The upper surface of the lower semiconductor layer 206 may be located at a higher level than the upper surface of the lowermost one of a plurality of transparent conductive oxide layers 112. The lower semiconductor layer 206 may fill the recess R1. The lower semiconductor layer 206 may extend through an information storage layer 220 including a blocking layer 222, a charge storage layer 224, and a tunnel dielectric layer 226. In some example embodiments, the lower horizontal width of the lower semiconductor layer 206 may be smaller than the upper horizontal width of the lower semiconductor layer 206.

The lower semiconductor layer 206 may not directly abut the transparent conductive oxide layer 112, and the information storage layer 220 may be disposed between the lower semiconductor layer 206 and the transparent conductive oxide layer 112. The lower surface of the information storage layer 220 may be located at a lower level than the upper surface of the substrate 102. For example, the lower surface of the blocking layer 222 may be located at a lower level than the upper surface of the substrate 102.

FIGS. 5-10 are vertical cross-sectional views illustrating in a process order of a method of manufacturing a semiconductor device according to some example embodiments of inventive concepts.

Figure 5:
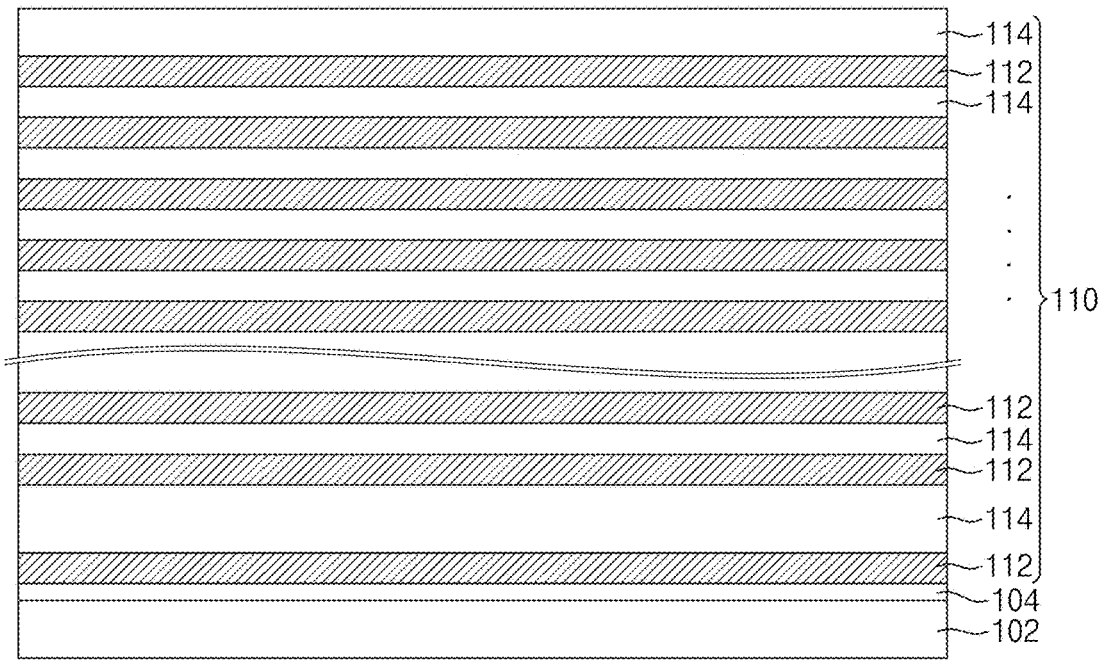
FIGS. 5-10 are vertical cross-sectional views illustrating in a process order of a method of manufacturing a semiconductor device according to some example embodiments of inventive concepts.

Referring to FIG. 5, a lower dielectric layer 104 may be stacked on a substrate 102. The lower dielectric layer 104 may include a silicon oxide. A stack structure 110 may be disposed on the lower dielectric layer 104. The stack structure 110 may include a plurality of transparent conductive oxide layers 112 and a plurality of dielectric layers 114, which are alternately stacked.

Each transparent conductive oxide layer 112 may be a metal oxide including Zn, Cd, In, Ga, Sn, Ti, Mg, Sb, Sr, Sn, Cu, Al, or a combination thereof. For example, the transparent conductive oxide layer 112 may include a binary metal oxide such as ZnO, CdO, $In_2O_3$, $Ga_2O_3$, $SnO_2$, and/or $TiO_2$. In addition, the transparent conductive oxide layer 112 may include a ternary metal oxide such as $MgIn_2O_4$, $GaInO_3$, $CdSb_2O_6$, $SrTiO_3$, $Zn_2In_2O_5$, $Zn_3In_2O_6$, $In_4Sn_3O_{12}$, $CdIn_2O_4$, $Cd_2SnO_4$, $CdSnO_3$, $Zn_2SnO_4$, $ZnSnO_3$, $CuAlO_2$, $CuGaO_2$, $CuInO_2$, and/or $SrCu_2O_2$. The transparent conductive oxide layer 112 may be an n-type electrode. For example, the n-type transparent conductive oxide layer 112 may be ZnO including an impurity such as Al, Ga, B, In, Y, Sc, V, Si, Ge, Ti, Zr, Hf, and/or F, $SnO_2$ including an impurity such as Sb, As, Nb, Ta, and/or F, and/or $TiO_2$ including an impurity such as Nb and/or Ta. In some example embodiments, the transparent conductive oxide layer 112 may be a p-type electrode. For example, the p-type transparent conductive oxide layer 112 may be ZnO including an impurity such as N, P, As, Sb, Li, Al, Ag, and/or Bi. In some example embodiments, each dielectric layer 114 may include a silicon oxide. The transparent conductive oxide layers 112 may have etch selectivity over the dielectric layers 114.

Figure 6:
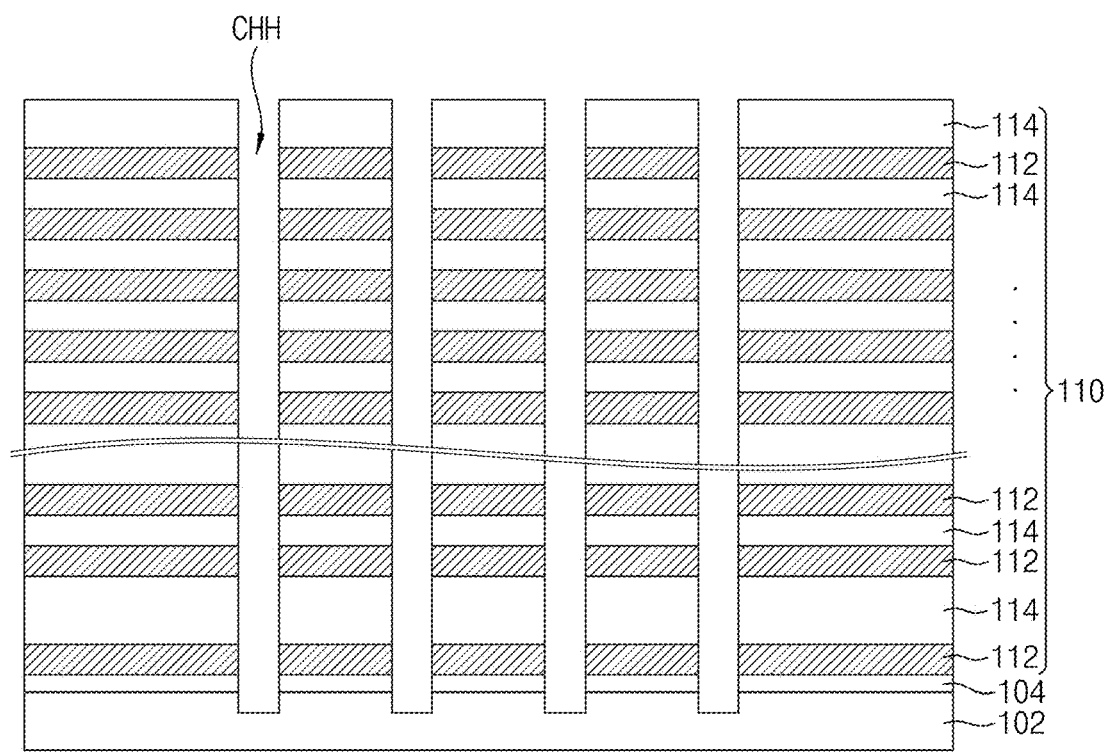

Referring to FIG. 6, a plurality of channel holes CHH may be formed so as to extend through the lower dielectric layer 104 and the stack structure 110. The channel holes CHH may be formed by anisotropic etching, or other suitable methods, and the upper surface of the substrate 102 may be exposed through the channel holes CHH. Each channel hole CHH cross-section may be circular, however the channel hole CHH cross-section may be other shapes as well, for example a hexagonal shape. In some example embodiments, the lower width of the channel hole CHH may be smaller than the upper width of the channel hole CHH. The channel hole CHH may include a portion of the upper surface of the substrate 102 may be etched by anisotropic etching.

Figure 7:
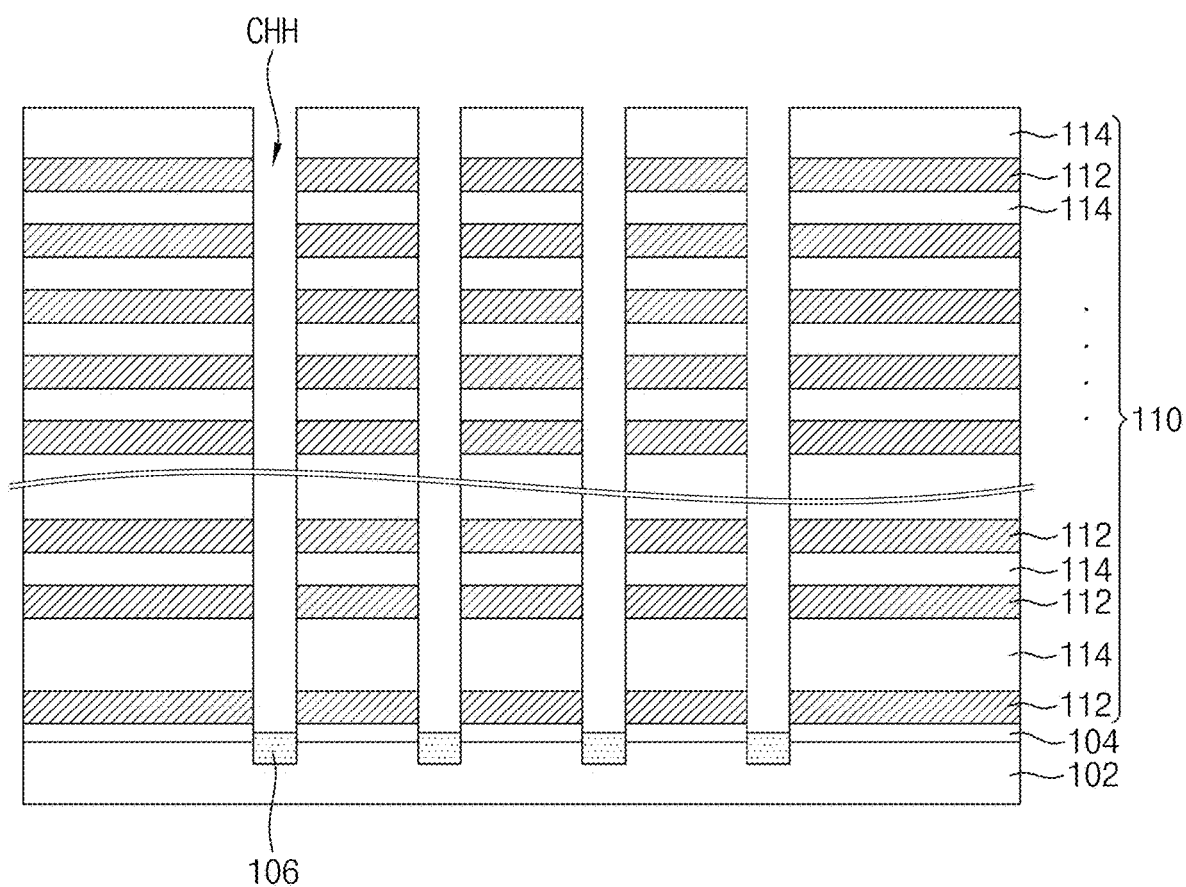

Referring to FIG. 7, a lower semiconductor layer 106 may be formed at the lower part of each channel hole CHH. The lower semiconductor layer 106 may be formed through selective epitaxial growth (SEG) using the substrate 102 as a seed. The lower semiconductor layer 106 may include silicon, germanium, silicon germanium, a group III-V compound, and/or a group II-VI compound. The lower semiconductor layer 106 may include an n-type impurity or a p-type impurity. In some example embodiments, the upper surface of the lower semiconductor layer 106 may be located at a lower level than the lower surface of the lowermost one of the transparent conductive oxide layers 112.

Figure 8:
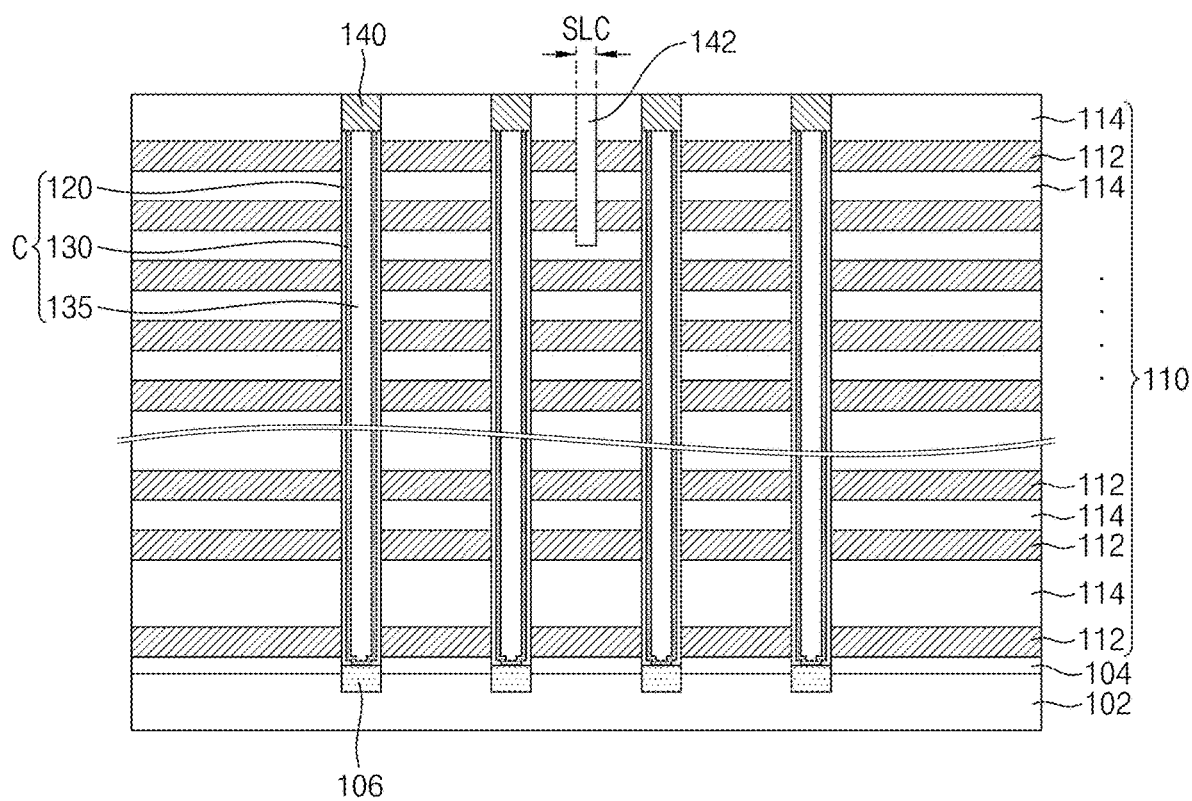

Referring to FIG. 8, a channel structure C and a conductive pad 140 may be formed in each channel hole CHH. The channel structure C may include an information storage layer 120, a channel layer 130, and a buried dielectric layer 135. The channel layer 130 may be disposed inside the information storage layer 120, and the buried dielectric layer 135 may be disposed inside the channel layer 130. The conductive pad 140 may be formed on the channel structure C. The conductive pad 140 may be electrically connected to the channel layer 130, and may cover the upper surface of the buried dielectric layer 135.

The channel layer 130 may include polysilicon. In some example embodiments, the channel layer 130 may include an n-type impurity or a p-type impurity. The buried dielectric layer 135 may include a silicon oxide, a silicon nitride, a silicon oxynitride, or a combination thereof. The conductive pad 140 may include doped polysilicon.

A string selection line cut SLC may be formed by etching a portion of the upper part of the stack structure 110. The string selection line cut SLC may separate at least one of the transparent conductive oxide layers 112. A selection line separation layer 142 may be formed in the string selection line cut SLC. The selection line separation layer 142 may extend in the second horizontal direction D2. The selection line separation layer may include a silicon oxide, a silicon nitride, a silicon oxynitride, or a combination thereof.

Figure 9:
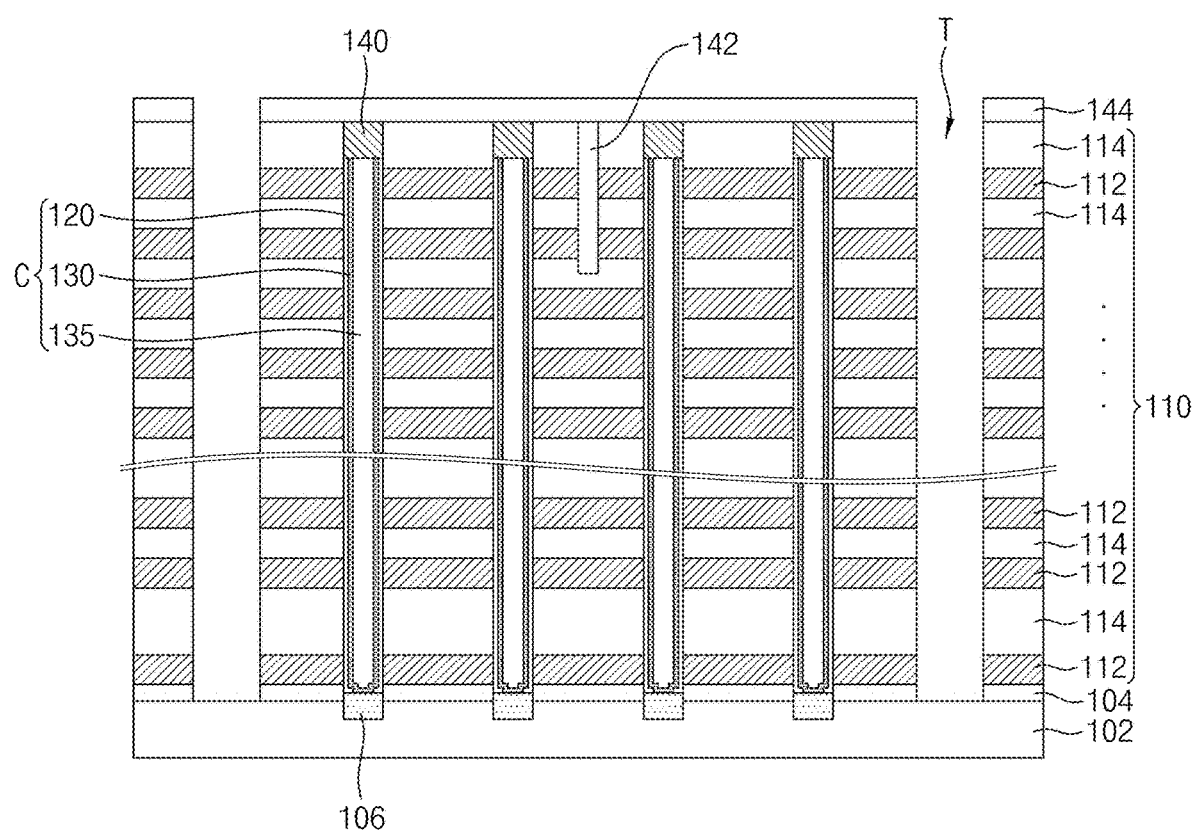

Referring to FIG. 9, a trench T may be formed so as to expose the upper surface of the substrate 102 while extending through the lower dielectric layer 104 and the stack structure 110. The trench T may be formed by anisotropic etching. The trench T may correspond to a word line cut. In some example embodiments, an interlayer dielectric layer 144 may be formed on the stack structure 110 before the trench T is formed.

Figure 10:
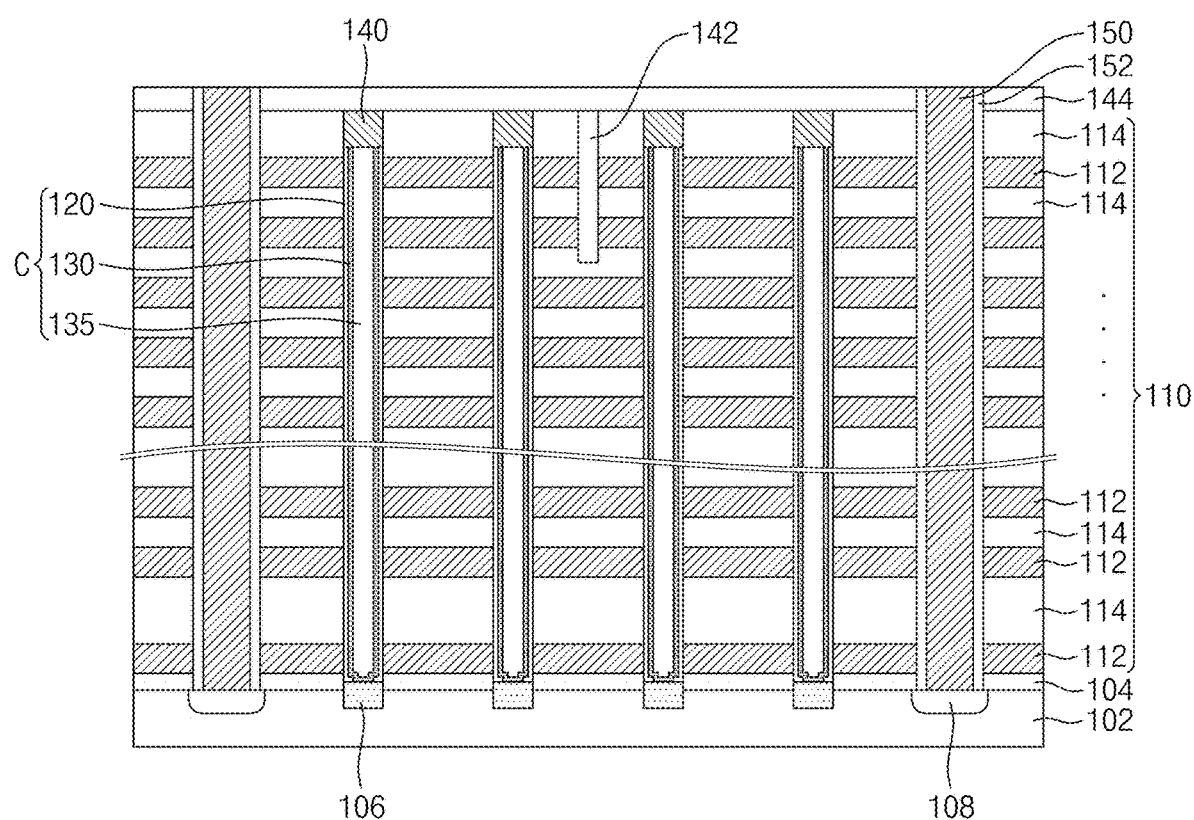

Referring to FIG. 10, a buried layer 150 and a side spacer 152 may be formed in the trench T. In some example embodiments, the substrate 102 may be doped with an impurity to form an impurity region 108 before the buried layer 150 and the side spacer 152 are formed.

The buried layer 150 may include a conductive material such as tungsten, aluminum, copper, titanium, tantalum, nickel silicide, titanium silicide, tungsten silicide, cobalt silicide, and/or polysilicon. The side spacer 152 may include a silicon oxide, a silicon nitride, a silicon oxynitride, or a combination thereof.

Referring back to FIG. 2, a first upper dielectric layer 160 may be formed so as to cover the interlayer dielectric layer 144. A sub-bit line plug 161 may be formed so as to extend through the interlayer dielectric layer 144 and the first upper dielectric layer 160, and may be connected to the conductive pad 140. A second upper dielectric layer 162 and a sub-bit line 163 may be formed on the first upper dielectric layer 160. The sub-bit line 163 may be connected to the sub-bit line plug 161. A third upper dielectric layer 164 and a bit line plug 165 may be formed on the second upper dielectric layer 162. The bit line plug 165 may be connected to the sub-bit line 163. A bit line 166 may be formed on the third upper dielectric layer 164, and may be connected to the bit line plug 165.

Each of the first upper dielectric layer 160, the second upper dielectric layer 162, and the third upper dielectric layer 164 may include a silicon oxide, a silicon nitride, a silicon oxynitride, or a combination thereof. Each of the sub-bit line plug 161, the sub-bit line 163, the bit line plug 165, and the bit line 166 may include a metal, a metal nitride, a metal oxide, a metal silicide, polysilicon, conductive carbon, or a combination thereof.

As shown in FIGS. 5 to 10, the transparent conductive oxide layers 112 may not be removed, and may be used as a gate electrode of a memory cell. Since the transparent conductive oxide layers 112 are more transparent than an insulating material such as a metal, a metal nitride, or a silicon nitride, misalignment may be reduced in a photolithography process or an etching process. In addition, a process of removing the transparent conductive oxide layers 112 may be omitted, whereby the device manufacturing process may be simplified.

Figure 11:
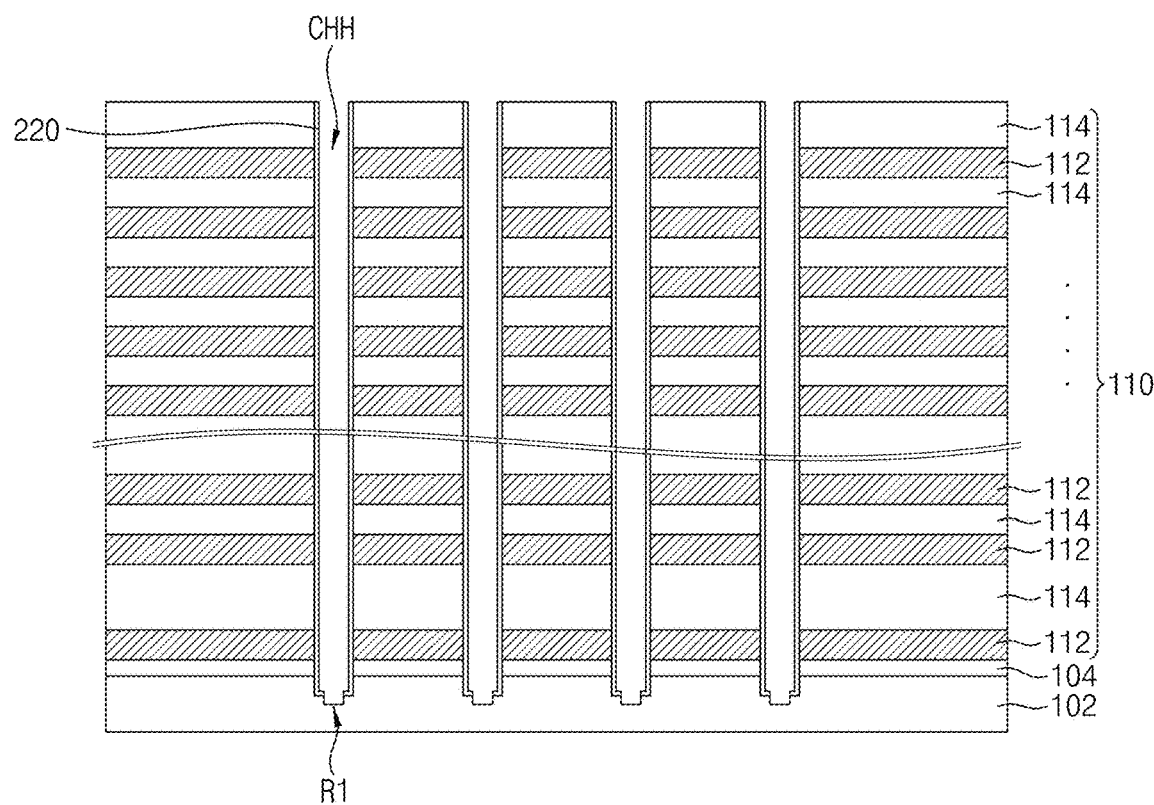
FIGS. 11-13 are vertical cross-sectional views illustrating in a process order of a method of manufacturing a semiconductor device according to some example embodiments of inventive concepts.
Figure 12:
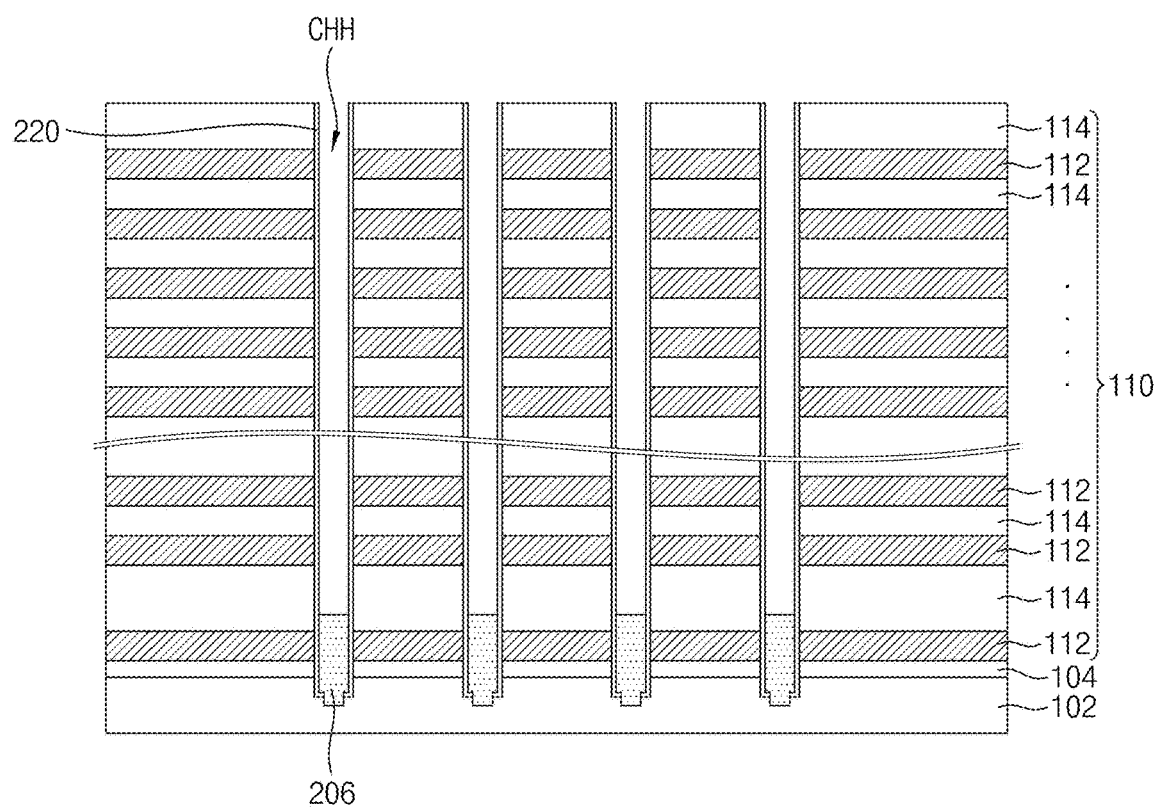
Figure 13:
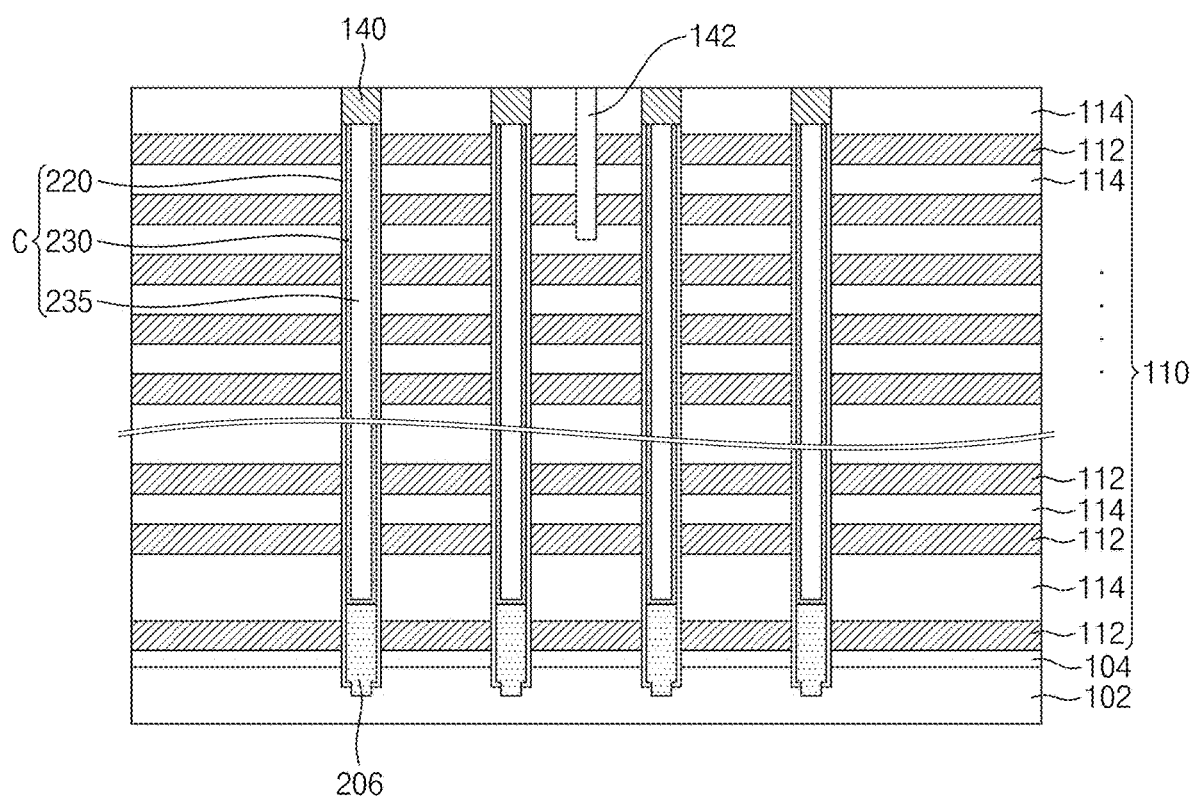

FIGS. 11-13 are vertical cross-sectional views illustrating in a process order of a method of manufacturing a semiconductor device according to some example embodiments of inventive concepts. FIGS. 11-13 are views illustrating a process of manufacturing the semiconductor device shown in FIG. 4.

Referring to FIG. 11, an information storage layer 220 may be formed on the resultant structure of FIG. 6. The information storage layer 220 may be formed conformally along the inner surface of each channel hole CHH, the upper surface of the substrate 102, and the upper surface of the stack structure 110. The lower surface of the information storage layer 220 may be located at a lower level than the upper surface of the substrate 102.

The lower surface of the information storage layer 220 may be etched to form a recess R1. The recess R1 may be formed in the lower surface of each channel hole CHH, and may expose the upper surface of the substrate 102. The recess R1 may be formed by anisotropic etching, and a portion of the upper surface of the substrate 102 may be etched. The information storage layer 220 located at the side surface of each channel hole CHH may not be removed.

Referring to FIG. 12, a lower semiconductor layer 206 may be formed at the lower part of each channel hole CHH. The lower semiconductor layer 26 may be formed through selective epitaxial growth using the substrate 102 as a seed. In some example embodiments, the upper surface of the lower semiconductor layer 206 may be located at a higher level than the upper surface of the lowermost one of the transparent conductive oxide layers 112. The information storage layer 220 may be disposed between the lowermost transparent conductive oxide layer 112 and the lower semiconductor layer 206.

Referring to FIG. 13, a channel layer 230 and a buried dielectric layer 235 may be formed in each channel hole CHH to form a channel structure C. The channel layer 230 may be formed along the side surface of the information storage layer 220 and the upper surface of the lower semiconductor layer 206. The buried dielectric layer 235 may be formed on the channel layer 230. The channel structure C may extend through a portion of the upper surface of the substrate 102, and may be electrically connected to the lower semiconductor layer 206. A conductive pad 140 may be formed on the channel structure C.

Figure 14:
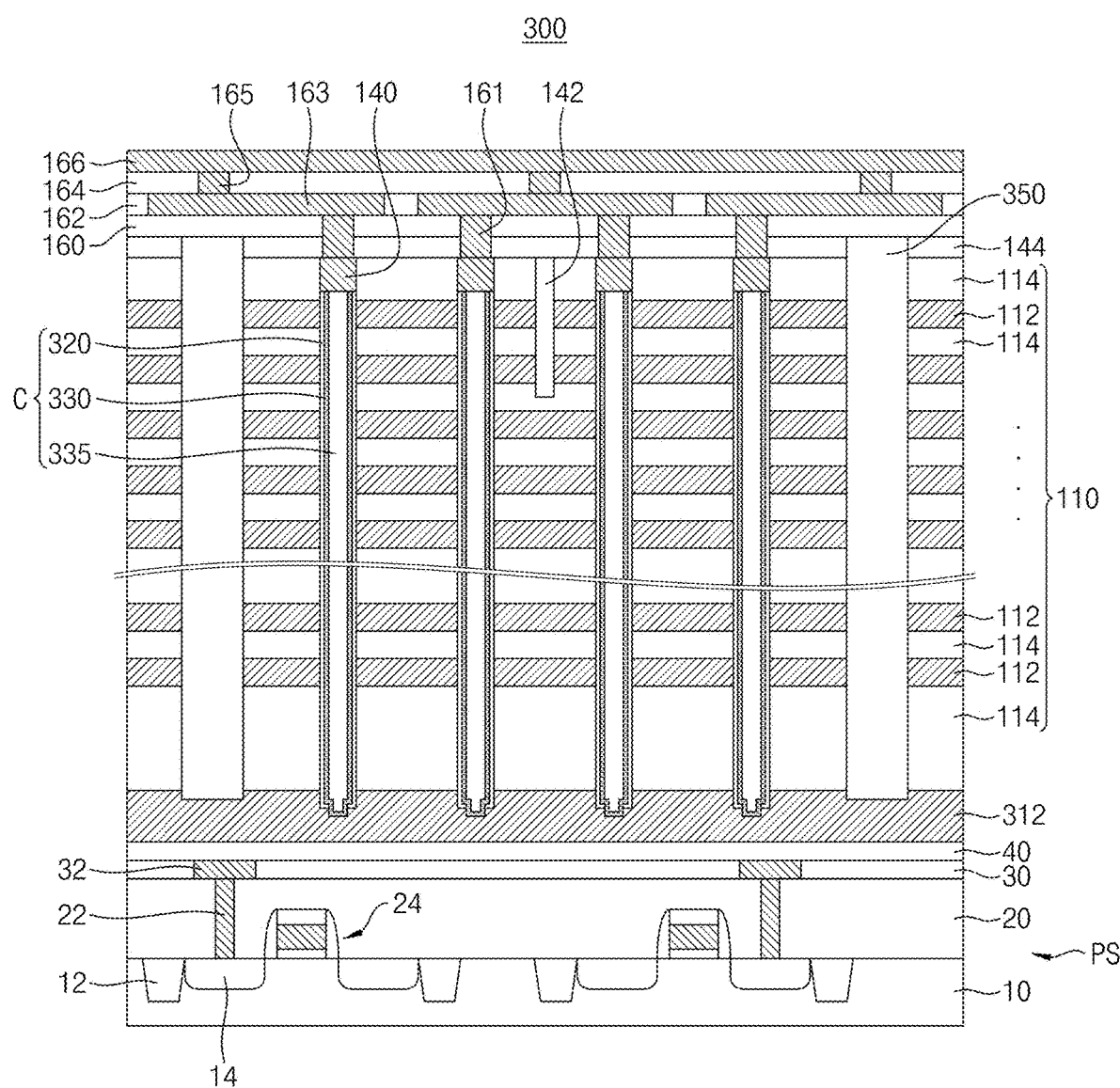
FIG. 14 is a vertical cross-sectional view of the semiconductor device according to some example embodiments of inventive concepts.

FIG. 14 is a vertical cross-sectional view of the semiconductor device according to some example embodiments of inventive concepts. A detailed description of the same construction as the semiconductor device shown in FIG. 2 may be omitted.

Referring to FIG. 14, the semiconductor device 300 according to the present disclosure may have a cell-over-peripheral (COP) structure. In some example embodiments, the semiconductor device 300 may include a peripheral circuit structure PS disposed at the lower part of a stack structure 110. The semiconductor device 300 may further include a lower conductive layer 312, a channel structure C, a conductive pad 140, and a buried layer 350.

The peripheral circuit structure PS may include a substrate 10, a device separation layer 12, an impurity region 14, a first lower dielectric layer 20, a contact plug 22, a peripheral circuit device 24, a second lower dielectric layer 30, a peripheral circuit wire 32, and a third lower dielectric layer 40. The substrate 10 may include the device separation layer 12 and the impurity region 14. The first lower dielectric layer 20, the contact plug 22, and the peripheral circuit device 24 may be disposed on the substrate 10. The impurity region 14 may be disposed adjacent to the peripheral circuit device 24. The first lower dielectric layer 20 may cover the contact plug 22 and the peripheral circuit device 24. The contact plug 22 may be electrically connected to the impurity region 14. The second lower dielectric layer 30 may be disposed on a first upper dielectric layer 160, and may cover the peripheral circuit wire 32. The peripheral circuit wire 32 may be connected to the contact plug 22. The third lower dielectric layer 40 may be disposed on the second lower dielectric layer 30.

The lower conductive layer 312 may be disposed on the peripheral circuit structure PS. A stack structure 110 including a plurality of transparent conductive oxide layers 112 and a plurality of dielectric layers 114 may be disposed on the lower conductive layer 312.

The channel structure C may extend through the stack structure 110 in the vertical direction. The channel structure C may extend through a portion of the upper surface of the substrate 302, and may be electrically connected to the lower conductive layer 312. The channel structure C may include an information storage layer 320, a channel layer 330, and a buried dielectric layer 335. The channel layer 330 may be disposed inside the information storage layer 320, and the buried dielectric layer 335 may be disposed inside the channel layer 330.

The buried layer 350 may extend through the stack structure 110 and an interlayer dielectric layer 144, and may abut the lower conductive layer 312. The buried layer 350 may extend in the second horizontal direction D2. The buried layer 350 may include a silicon oxide, a silicon nitride, a silicon oxynitride, or a combination thereof.

Figure 15:
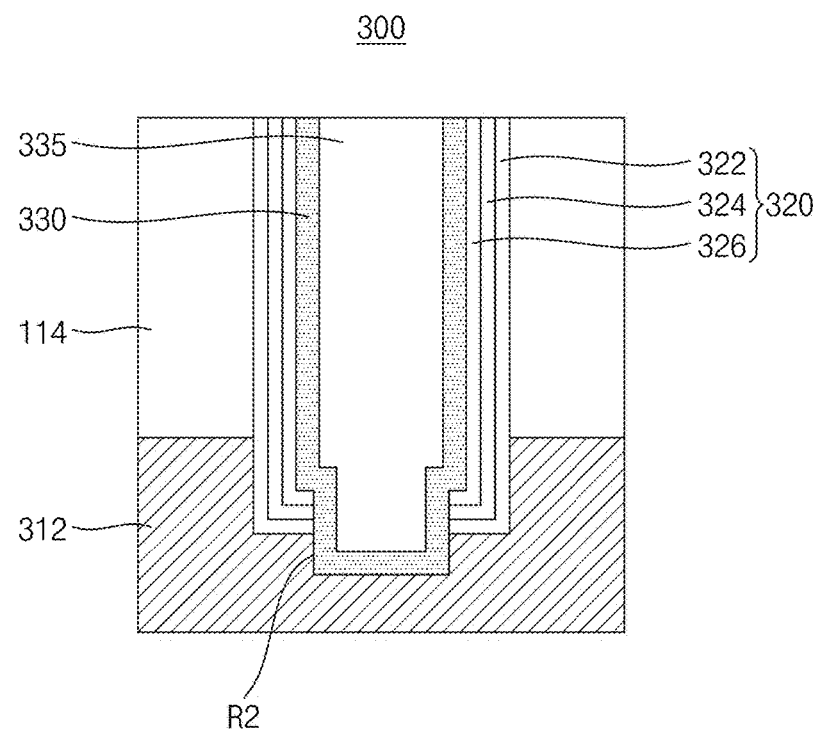
FIG. 15 is a partial enlarged view of the semiconductor device shown in FIG. 14.

FIG. 15 is a partial enlarged view of the semiconductor device shown in FIG. 14.

Referring to FIG. 15, the information storage layer 320 may include a blocking layer 322, a charge storage layer 324, and a tunnel dielectric layer 326. The charge storage layer 324 may be disposed inside the blocking layer 322, and the tunnel dielectric layer 326 may be disposed inside the charge storage layer 324.

The lower conductive layer 312 may include a recess R2 formed in the upper surface thereof. The lower surface of the channel layer 330 may fill at least a portion of the recess R2. The outer circumference of the lower part of the channel layer 330 may be smaller than the outer circumference of the upper part of the channel layer 330. The channel layer 330 may be formed conformally along the inner wall of the information storage layer 220 and the inner wall of the recess R2. However, the present disclosure is not limited thereto. The side surface of the recess R2 may abut the information storage layer 320. The lower surface of the information storage layer 220 may be located at a lower level than the upper surface of the lower conductive layer 312. For example, the lower surface of the blocking layer 322 may be located at a lower level than the upper surface of the lower conductive layer 312.

FIGS. 16-22 are vertical cross-sectional views illustrating in a process order of a method of manufacturing a semiconductor device according to some example embodiments of inventive concepts.

Figure 16:
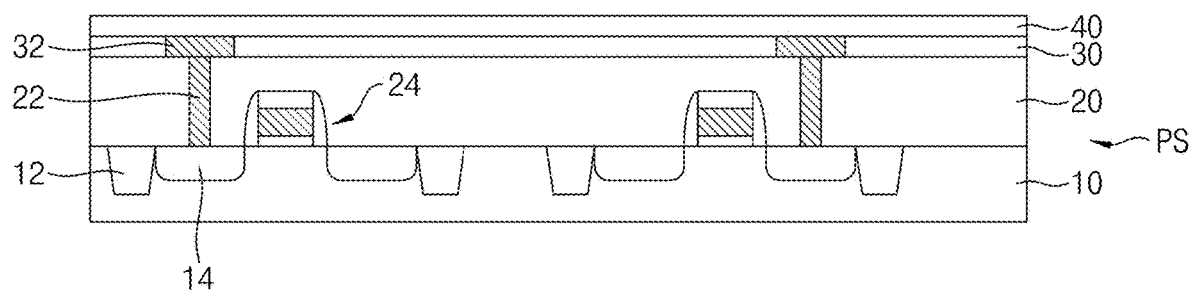
FIGS. 16-22 are vertical cross-sectional views illustrating in a process order of a method of manufacturing a semiconductor device according to some example embodiments of inventive concepts.

Referring to FIG. 16, a peripheral circuit structure PS may be provided. The peripheral circuit structure PS may include a substrate 10, a device separation layer 12, an impurity region 14, a first lower dielectric layer 20, a contact plug 22, a peripheral circuit device 24, a second lower dielectric layer 30, a peripheral circuit wire 32, and a third lower dielectric layer 40. The device separation layer 12 and the impurity region 14 may be formed at the upper surface of the substrate 10. In some example embodiments, the device separation layer 12 may include an insulating material such as a silicon oxide or a silicon nitride. The impurity region 14 may include an n-type impurity or a p-type impurity.

The peripheral circuit device 24 may be formed adjacent to the impurity region 14, and the first lower dielectric layer 20 may be formed so as to cover the peripheral circuit device 24. The contact plug 22 may be connected to the impurity region 14 through the first lower dielectric layer 20. The peripheral circuit wire 32, which is connected to the contact plug 22, may be formed on the first lower dielectric layer 20. The second lower dielectric layer 30 and the third lower dielectric layer 40 may be formed so as to cover the peripheral circuit wire 32.

Figure 17:
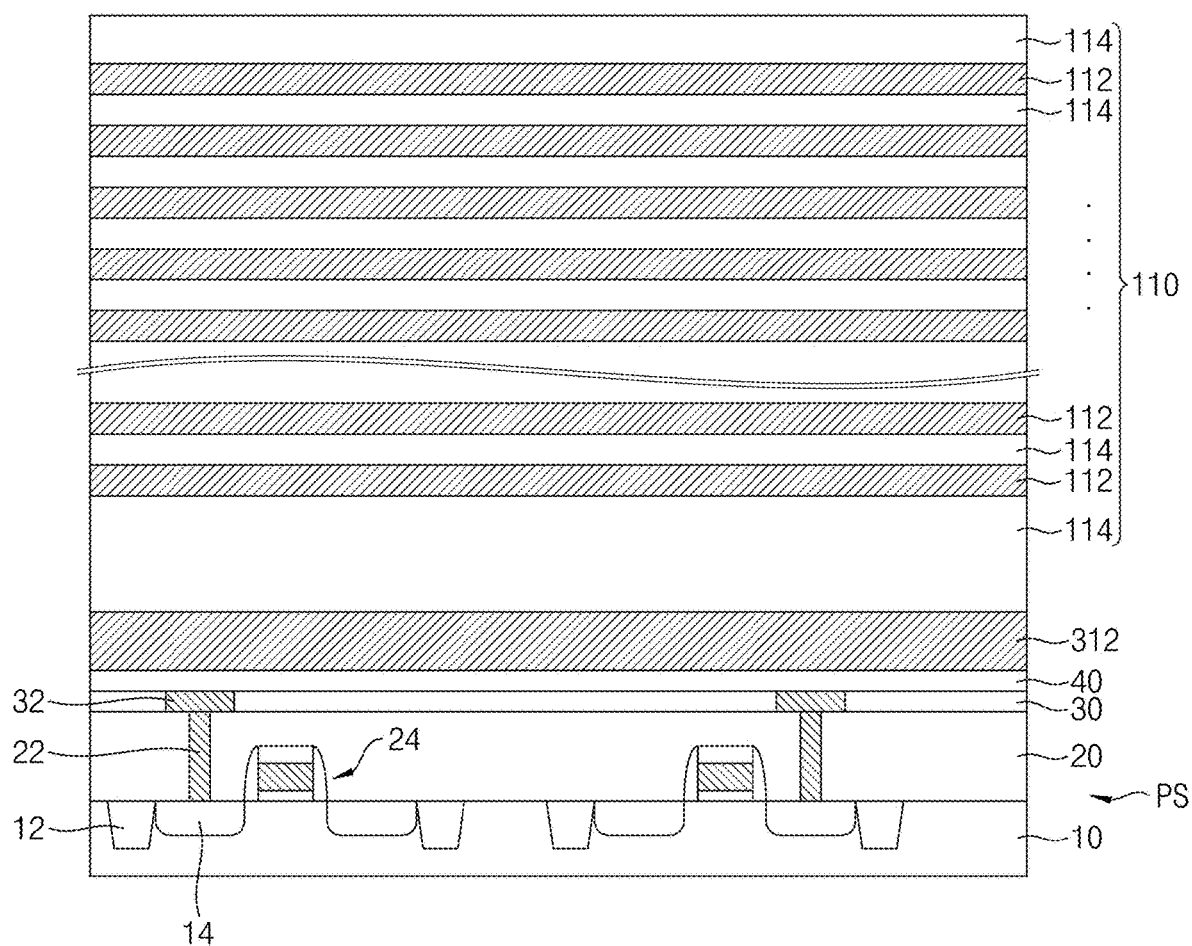

Referring to FIG. 17, a lower conductive layer 312 and a stack structure 110 may be stacked on the peripheral circuit structure PS. The stack structure 110 may be disposed on the lower conductive layer 312. The stack structure 110 may include a plurality of transparent conductive oxide layers 112 and a plurality of dielectric layers 114, which are alternately stacked. In some example embodiments, the lower conductive layer 312 may include the same material as the transparent conductive oxide layers 112.

Figure 18:
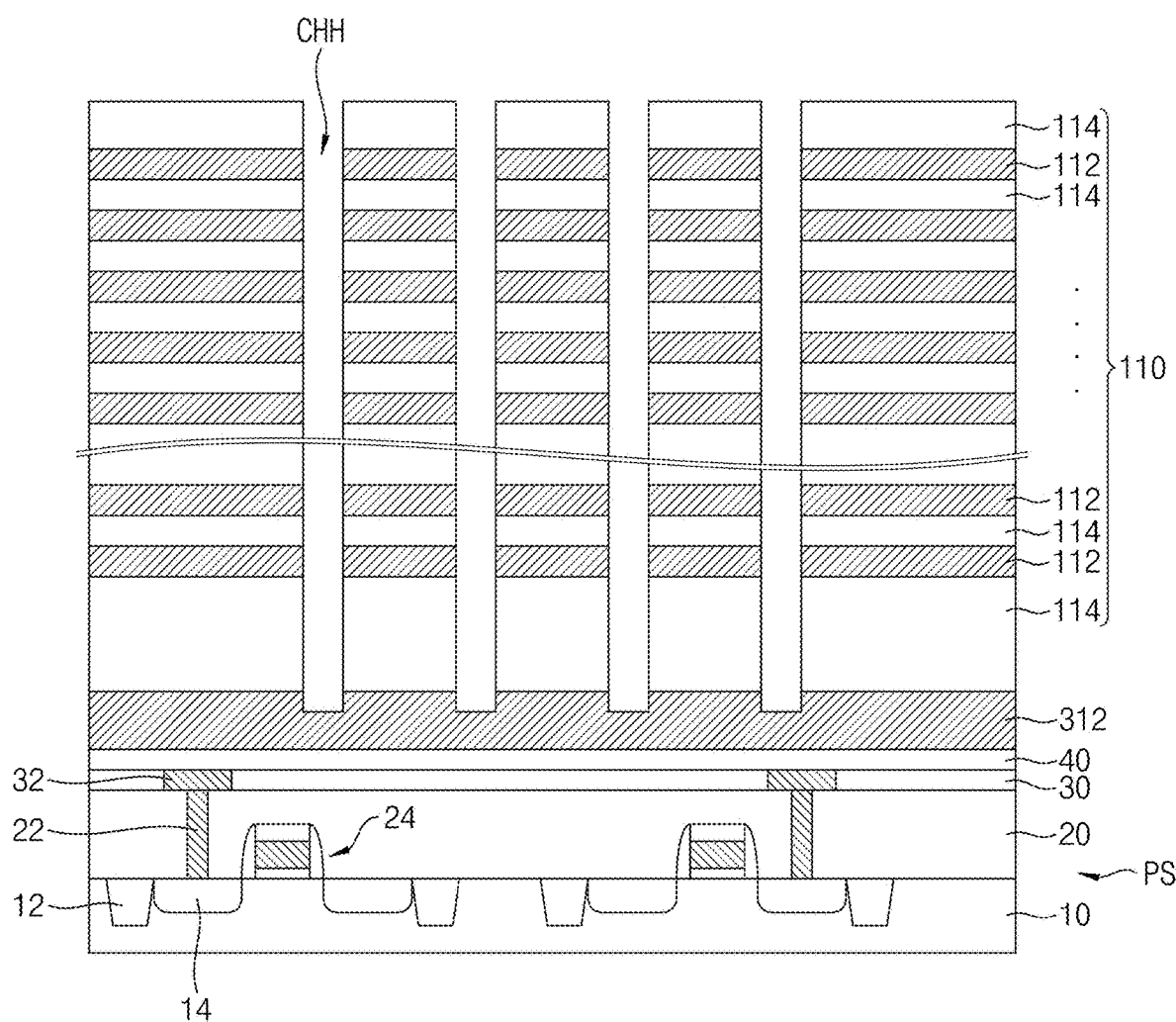

Referring to FIG. 18, a plurality of channel holes CHH may be formed so as to extend through the lower conductive layer 312 and the stack structure 110. The upper surface of the lower conductive layer 312 may be exposed through the channel holes CHH.

Figure 19:
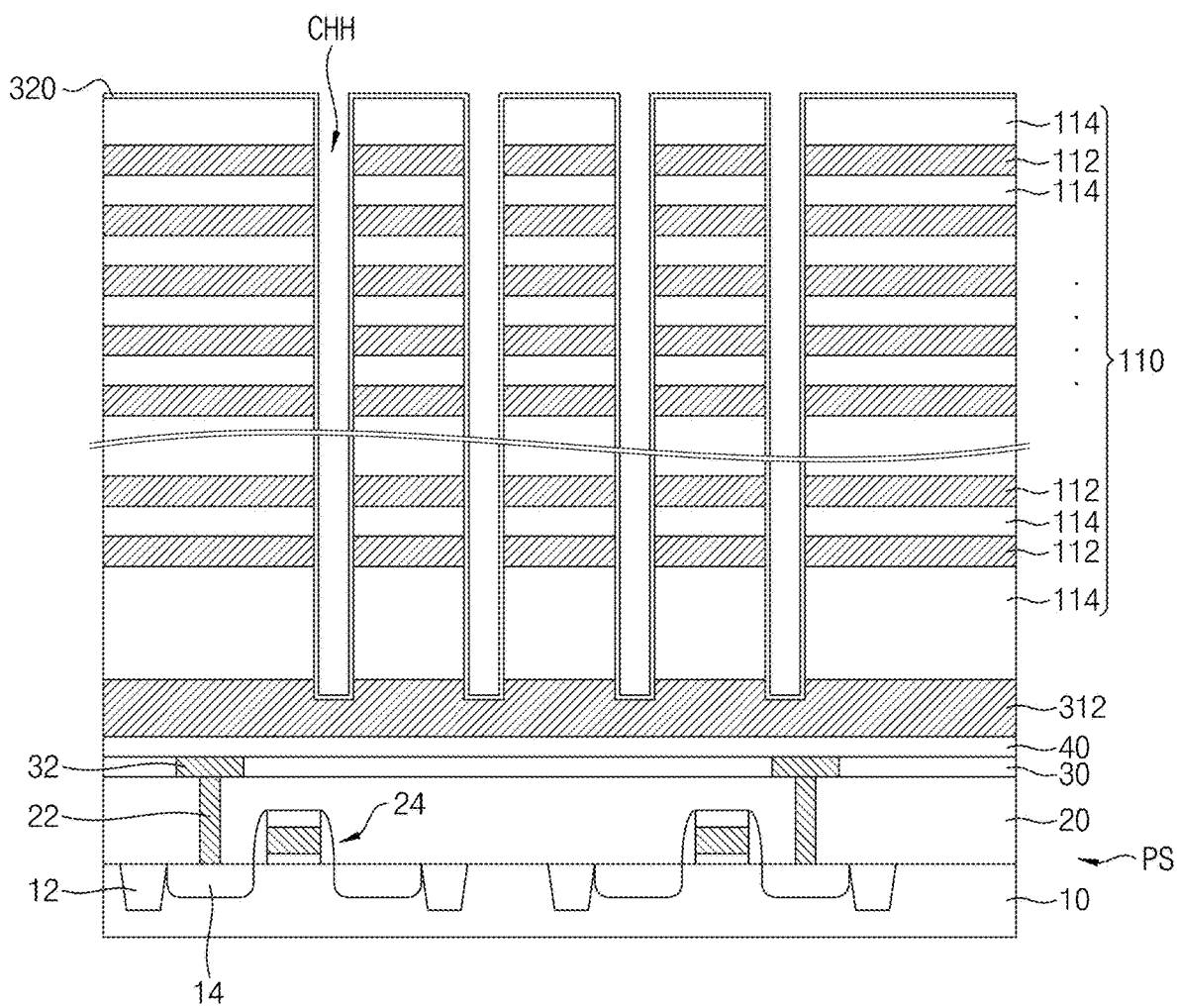

Referring to FIG. 19, an information storage layer 320 may be formed on the resultant structure of FIG. 18. The information storage layer 320 may be formed conformally along the inner surface of each channel hole CHH, the upper surface of the lower conductive layer 312, and the upper surface of the stack structure 110. The information storage layer 320 may include a blocking layer 322, a charge storage layer 324, and a tunnel dielectric layer 326, which are sequentially stacked.

Figure 20:
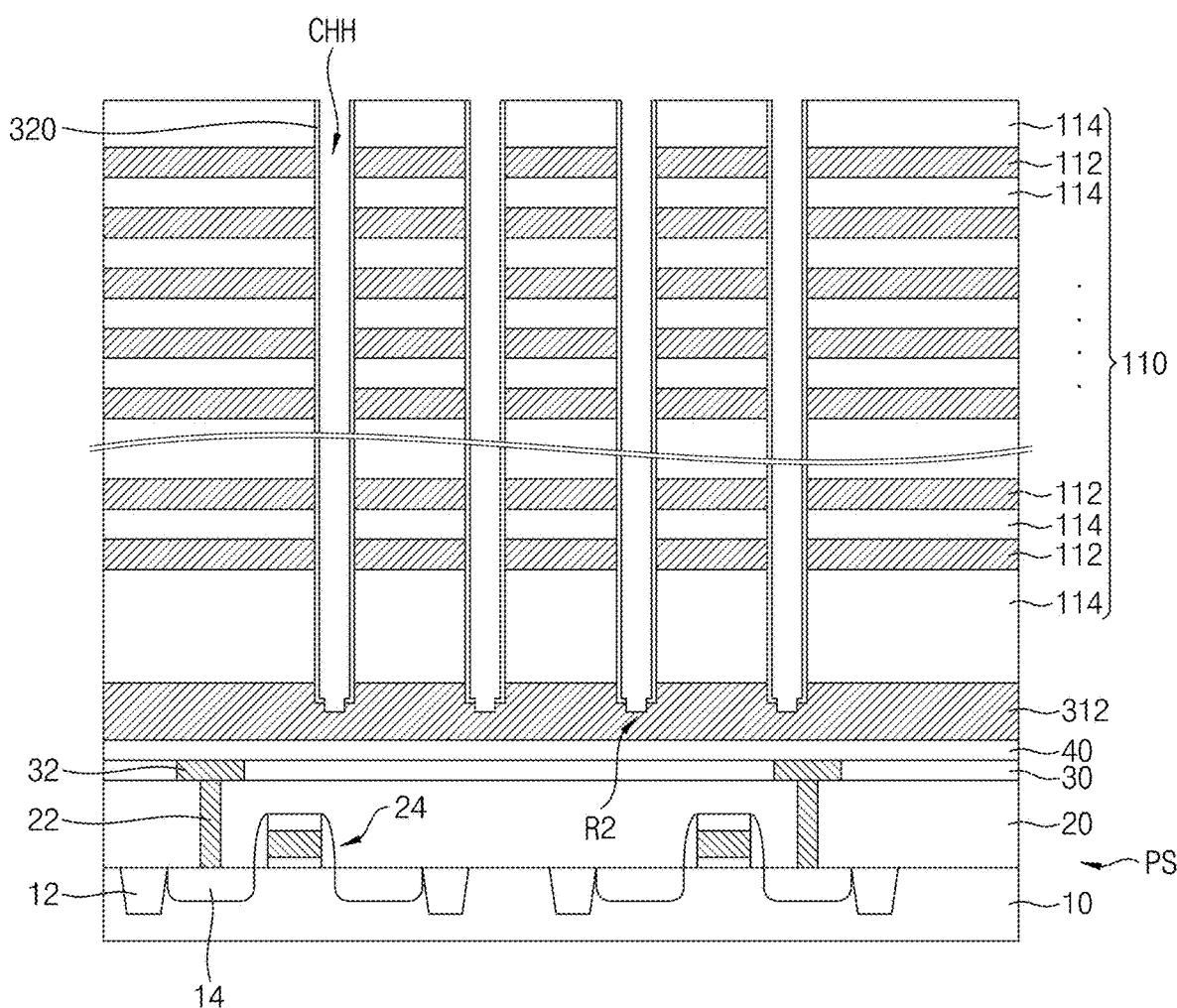

Referring to FIG. 20, the information storage layer 320 may be etched to form a recess R2. The recess R2 may be formed in the lower surface of each channel hole CHH, and may expose the upper surface of the lower conductive layer 312. A portion of the upper surface of the lower conductive layer 312 may be etched. The information storage layer 220 located at the side surface of each channel hole CHH may not be removed.

Figure 21:
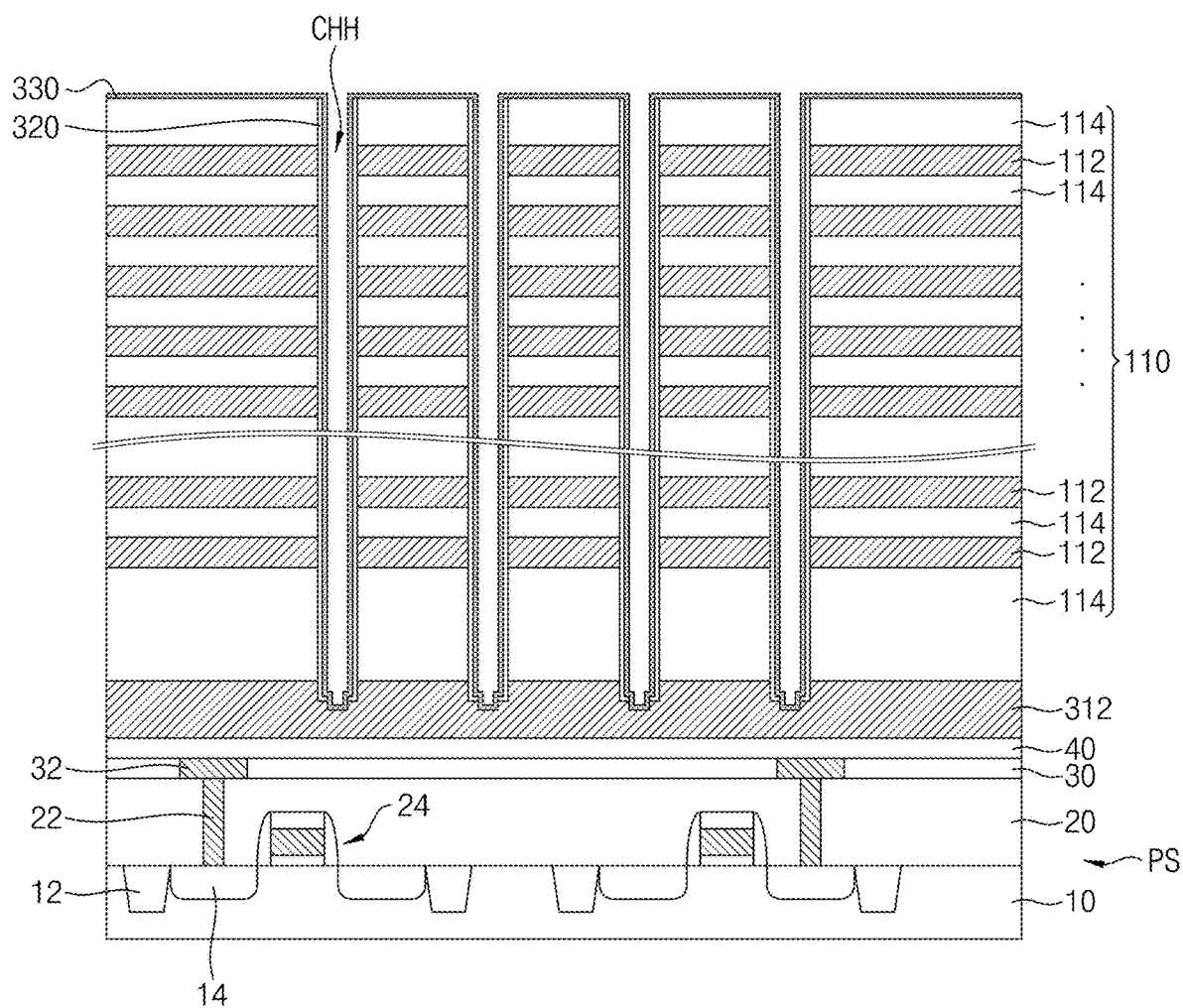

Referring to FIG. 21, a channel layer 330 may be formed on the resultant structure of FIG. 20. The channel layer 330 may be formed conformally along the side surface of the information storage layer 320, the upper surface of the lower conductive layer 312, and the upper surface of the stack structure 110. The channel layer 330 may fill at least a portion of the recess R2, and may abut the lower conductive layer 312.

Figure 22:
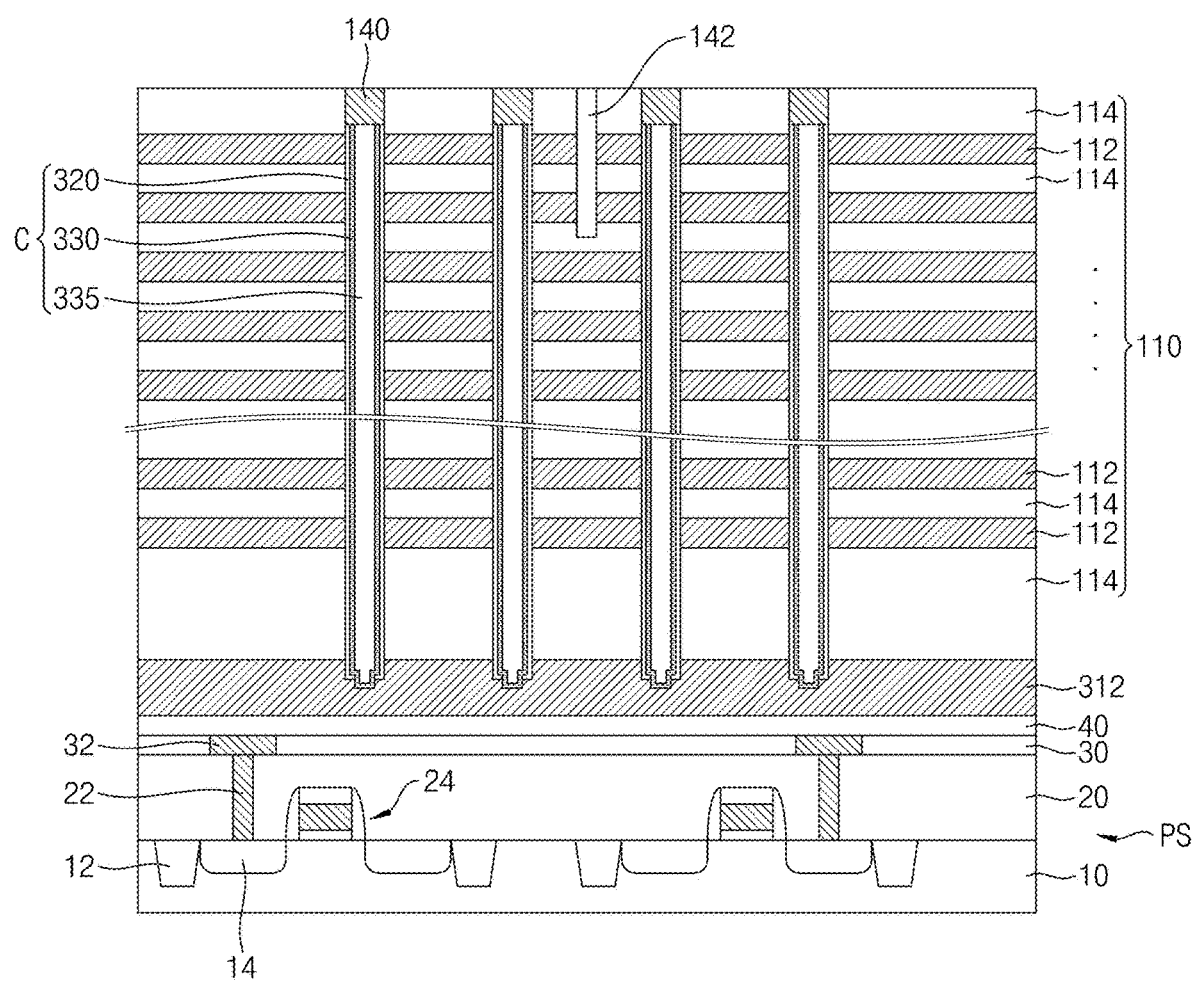

Referring to FIG. 22, a buried dielectric layer 335 may be formed inside the channel layer 330 to form a channel structure C. The channel structure C may include an information storage layer 320, a channel layer 330, and a buried dielectric layer 335. A conductive pad 140 may be formed on the channel structure C. A selection line separation layer 142 may be formed by etching a portion of the upper part of the stack structure 110. The selection line separation layer 142 may extend in the second horizontal direction D2.

Referring back to FIG. 14, a sub-bit line plug 161, a sub-bit line 163, a bit line plug 165, and a bit line 166 may be formed on the stack structure 110 so as to be electrically connected to the conductive pad 140.

Figure 23:
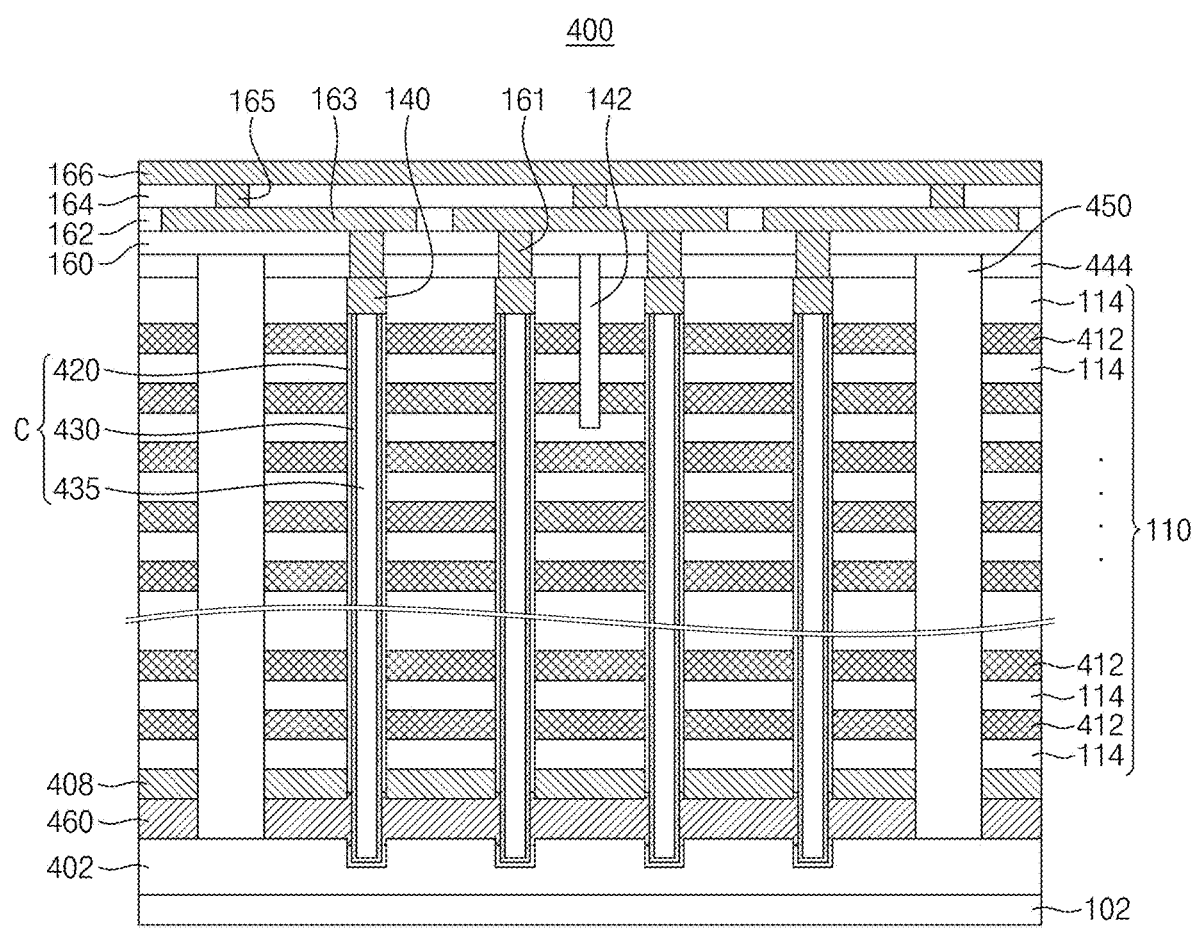
FIG. 23 is a vertical cross-sectional view of the semiconductor device according to some example embodiments of inventive concepts.

FIG. 23 is a vertical cross-sectional view of the semiconductor device according to some example embodiments of inventive concepts.

Referring to FIG. 23, the semiconductor device 400 according to the present disclosure may include a source layer 402, a support layer 408, a gate electrode layer 412, an interlayer dielectric layer 444, a buried layer 450, and a conductive line 460. The semiconductor device 400 may further include a channel structure C including an information storage layer 420, a channel layer 430, and a buried dielectric layer 435.

The source layer 402, the conductive line 460, and the support layer 408 may be sequentially disposed on a substrate 102. The substrate 102 may be a semiconductor layer including a p-type impurity, and each of the source layer 402 and the support layer 408 may be a semiconductor layer including an n-type impurity. The conductive line 460 may include a metal, a metal nitride, a metal oxide, a metal silicide, polysilicon, conductive carbon, or a combination thereof.

A stack structure 110 may include a plurality of dielectric layers 114 and a plurality of gate electrode layers 412, which are alternately stacked. Each gate electrode layer 412 may include a metal, a metal nitride, a metal oxide, a metal silicide, polysilicon, conductive carbon, or a combination thereof. The buried layer 450 may extend through the stack structure 110 and the interlayer dielectric layer 444.

Figure 24:
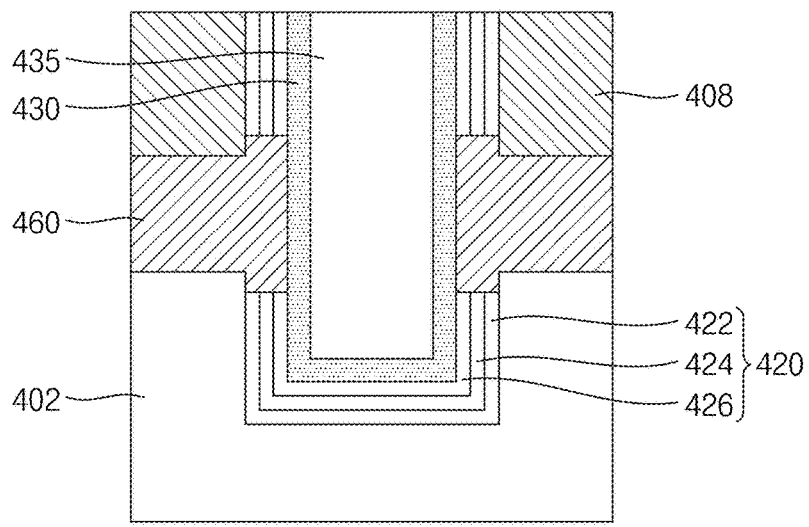
FIG. 24 is a partial enlarged view of the semiconductor device shown in FIG. 23.

FIG. 24 is a partial enlarged view of the semiconductor device shown in FIG. 23.

Referring to FIG. 24, the information storage layer 420 may include a blocking layer 422, a charge storage layer 424, and a tunnel dielectric layer 426. The charge storage layer 424 may be disposed inside the blocking layer 422, and the tunnel dielectric layer 426 may be disposed inside the charge storage layer 424. The tunnel dielectric layer 426 may abut the channel layer 430.

The conductive line 460 may extend through the information storage layer 420, and may abut the side surface of the channel layer 430. For example, the lower surface of the conductive line 460 may be located at a higher level than the lower surface of the channel layer 430. The conductive line 460 may correspond to a common source line (CSL).

FIGS. 25-29 are vertical cross-sectional views illustrating in a process order of a method of manufacturing a semiconductor device according to some example embodiments of inventive concepts.

Figure 25:
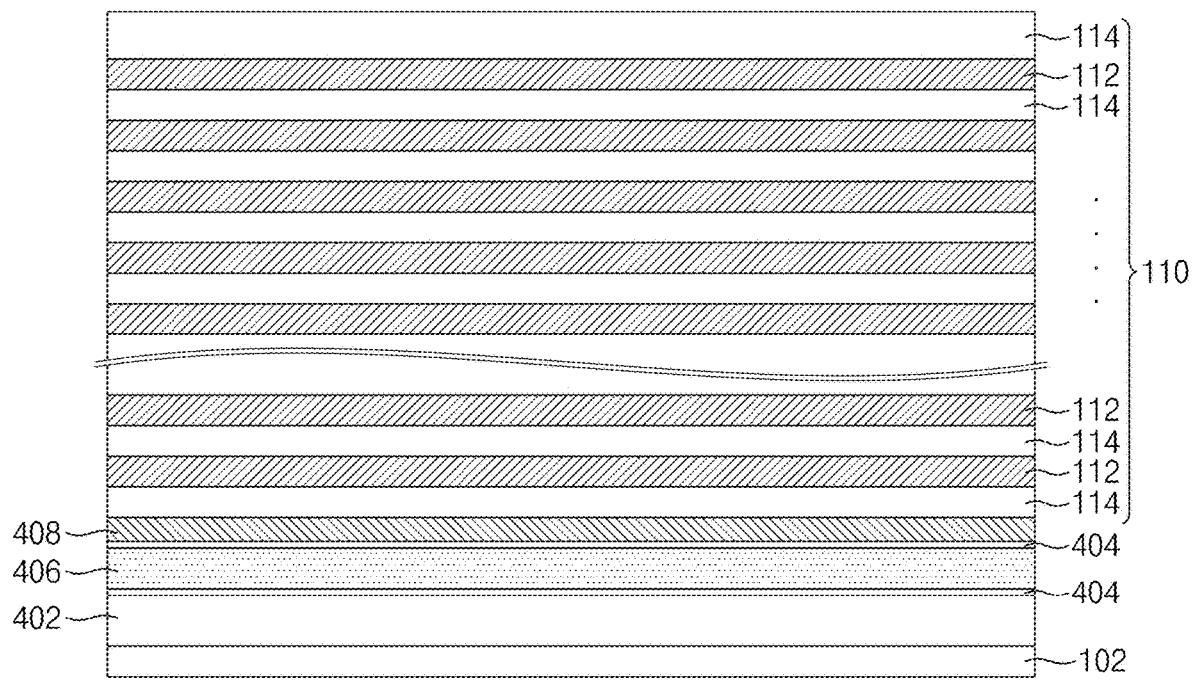
FIGS. 25-29 are vertical cross-sectional views illustrating in a process order of a method of manufacturing a semiconductor device according to some example embodiments of inventive concepts.

Referring to FIG. 25, a source layer 402 may be formed on a substrate 102. A sacrificial layer 406 and a support layer 408 may be sequentially stacked on the source layer 402. Passivation layers 404 may be disposed at the upper part and the lower part of the sacrificial layer 406. A stack structure 110 including a plurality of dielectric layers 114 and a plurality of transparent conductive oxide layers 112 may be disposed on the support layer 408.

The source layer 402 may be a semiconductor layer including an n-type impurity. The support layer 408 may include polysilicon. Each passivation layer 404 may include a material having etch selectivity over the sacrificial layer 406. In some example embodiments, each passivation layer 404 may include a silicon oxide, and the sacrificial layer 406 may include a silicon nitride.

Figure 26:
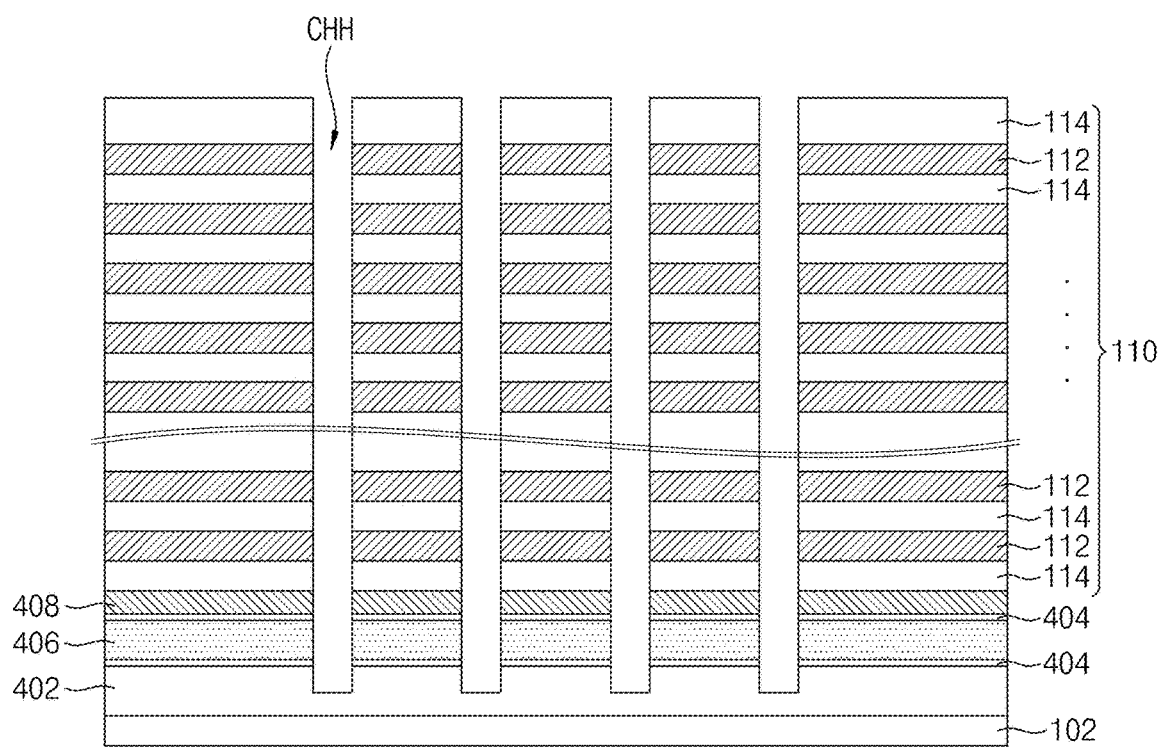

Referring to FIG. 26, a plurality of channel holes CHH may be formed so as to extend through the stack structure 110, the passivation layers 404, the sacrificial layer 406, and the support layer 408. A portion of the upper surface of the source layer 402 may be etched, and the upper surface of the source layer 402 may be exposed through the channel holes CHH. In addition, the side surface of the sacrificial layer 406 may be exposed through the channel holes CHH.

Figure 27:
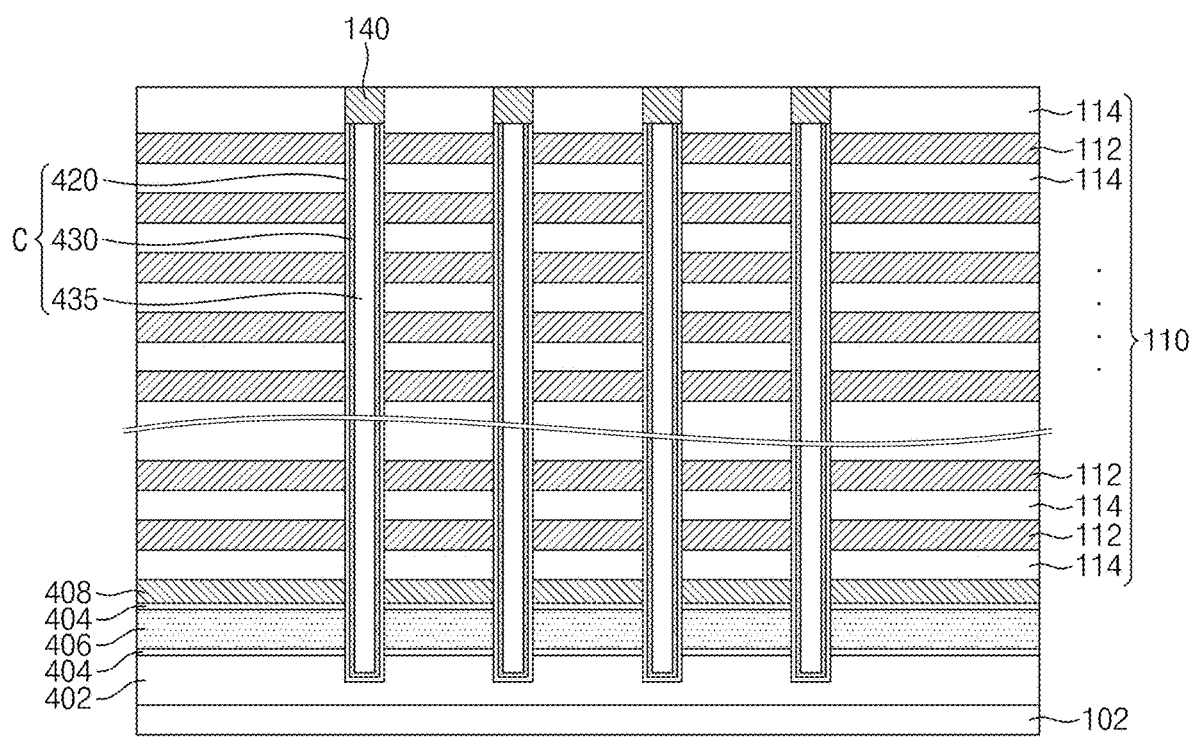

Referring to FIG. 27, a channel structure C and a conductive pad 140 may be formed in each of the channel holes CHH. The channel structure C may include an information storage layer 420, a channel layer 430, and a buried dielectric layer 435. The conductive pad 140 may be disposed on the channel structure C. The conductive pad 140 may cover the upper surface of the buried dielectric layer 435, and may be electrically connected to the channel layer 430. The sacrificial layer 406 may abut the side surface of the information storage layer 420

Figure 28:
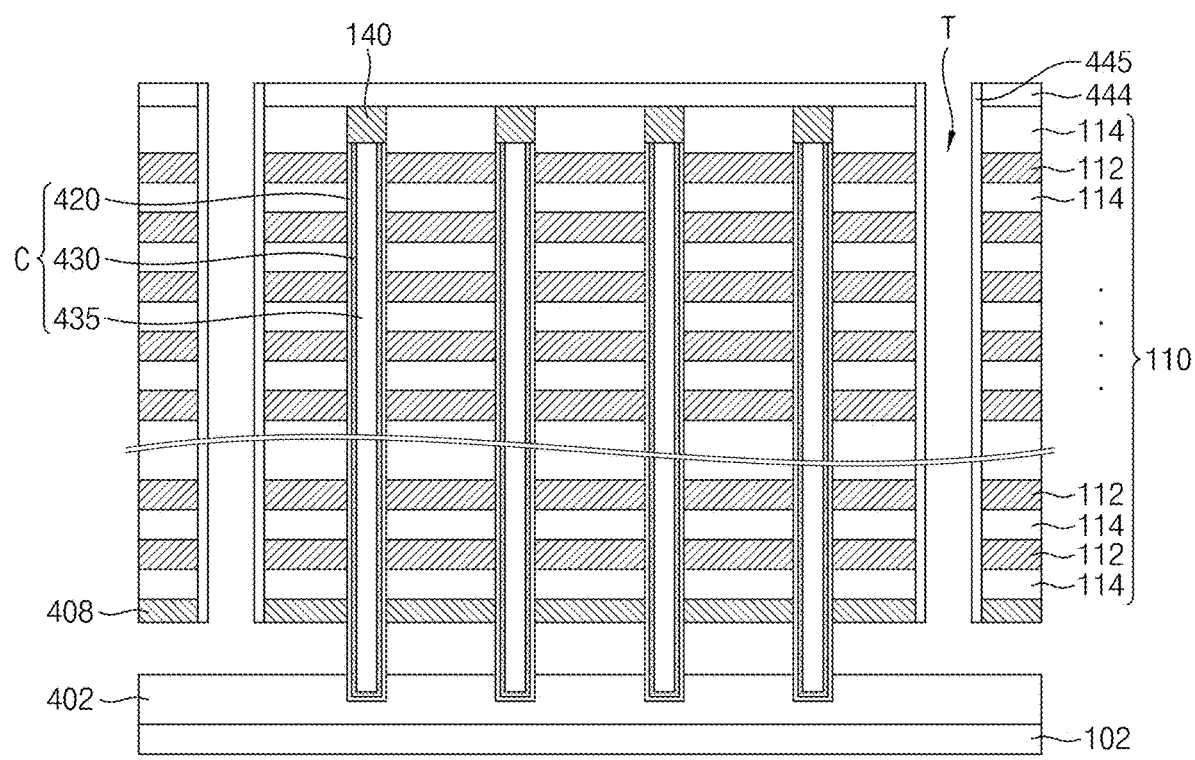

Referring to FIG. 28, a trench T may be formed so as to expose the upper surface of the source layer 402 while extending through the stack structure 110. The trench T may be formed by anisotropic etching. An interlayer dielectric layer 444 may be formed on the stack structure 110 before the trench T is formed. The side surfaces of the passivation layers 404 and the sacrificial layer 406 may be exposed through the trench T. The sacrificial layer 406 may be selectively removed such that the side surface of the channel structure C is exposed. Subsequently, the passivation layers 404 may be removed, and the upper surface of the source layer 402 may be exposed. A side spacer 445 may be formed at the side surface of the trench T before the passivation layers 404 and the sacrificial layer 406 are removed. The side spacer 445 may prevent the dielectric layers 114 and the transparent conductive oxide layers from being etched. The side spacer 445 may include a material having etch selectivity over the stack structure 110, and may include, for example, polysilicon.

Figure 29:
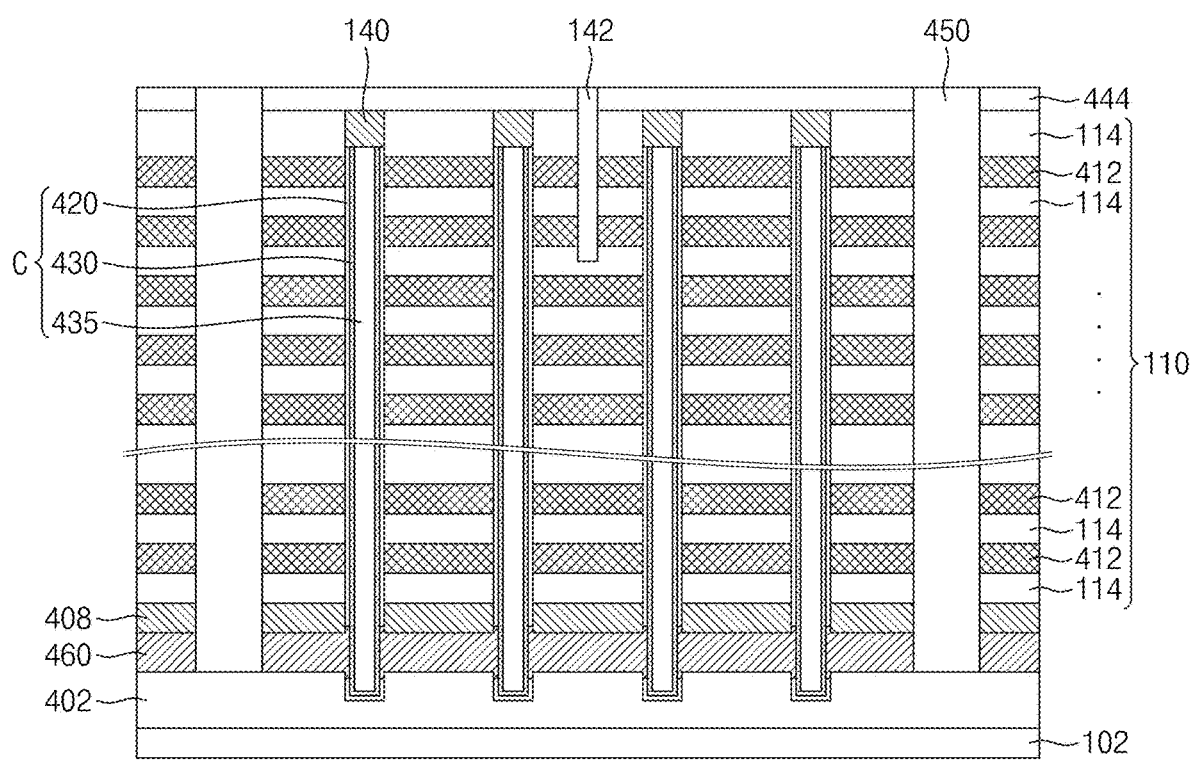

Referring to FIG. 29, a conductive line 460 may fill a space defined as the result of removal of the passivation layers 404 and the sacrificial layer 406. Referring to FIG. 24, a portion of the side surface of the information storage layer 420 may be etched such that the channel layer 430 is exposed before the conductive line 460 is formed. The conductive line 460 may abut the side surface of the channel layer 430. The conductive line 460 may include a metal, a metal nitride, a metal oxide, a metal silicide, polysilicon, conductive carbon, or a combination thereof.

The transparent conductive oxide layers 112 may be selectively removed, and gate electrode layers 412 may be formed in spaces defined as the result of removal of the transparent conductive oxide layers 112. Each gate electrode layer 412 may include W, WN, Ti, TiN, Ta, TaN, or a combination thereof.

A buried layer 450 may be formed in the stack structure 110, and may fill the trench T. A selection line separation layer 142 may be formed at the upper part of the stack structure 110. The selection line separation layer 142 may separate at least one of the gate electrode layers 412. Each of the buried layer 450 and the selection line separation layer 142 may include a silicon oxide, a silicon nitride, a silicon oxynitride, or a combination thereof.

Referring back to FIG. 23, a sub-bit line plug 161, a sub-bit line 163, a bit line plug 165, and a bit line 166 may be formed on the stack structure 110 so as to be electrically connected to the conductive pad 140.

Figure 30:
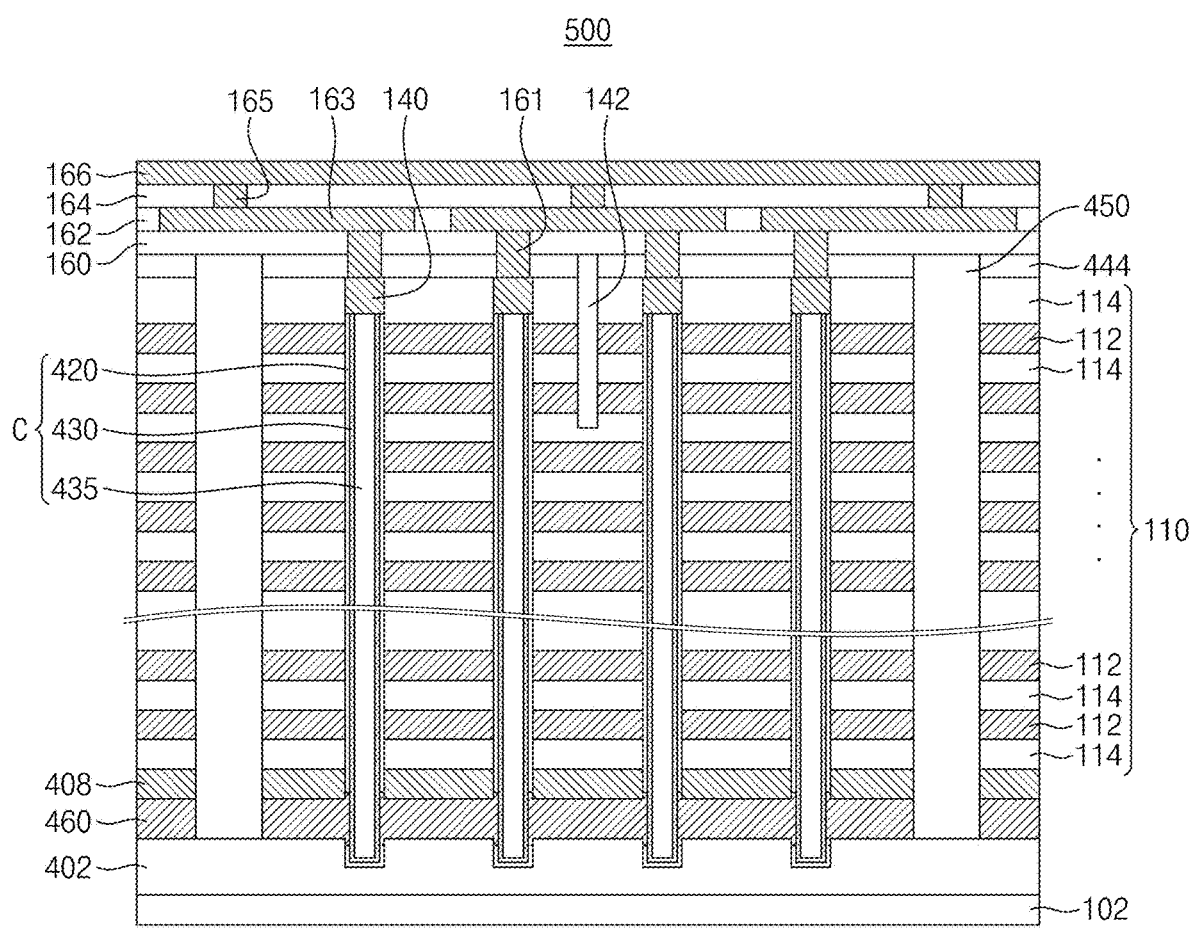
FIG. 30 is a vertical cross-sectional view of the semiconductor device according to some example embodiments of inventive concepts.

FIG. 30 is a vertical cross-sectional view of the semiconductor device according to some example embodiments of inventive concepts.

Referring to FIG. 30, the semiconductor device 500 may include a stack structure 110 including a plurality of transparent conductive oxide layers 112 and a plurality of dielectric layers 114, which are alternately stacked. Referring to FIGS. 27 to 29, after the passivation layers 404 and the sacrificial layer 406 are removed and the conductive line 460 is formed, the transparent conductive oxide layers 112 may not be removed. In some example embodiments, a method of manufacturing the semiconductor device 500 may include etching a portion of the side surface of an information storage layer 420 to expose a channel layer 430, forming a conductive line 460 at the lower part of a support layer 408 so as to abut the side surface of the channel layer 430, anisotropically etching a portion of the conductive line 460 along a trench T, removing a side spacer 445, and forming a buried layer 450 so as to fill the trench T while abutting a source layer 402.

Figure 31:
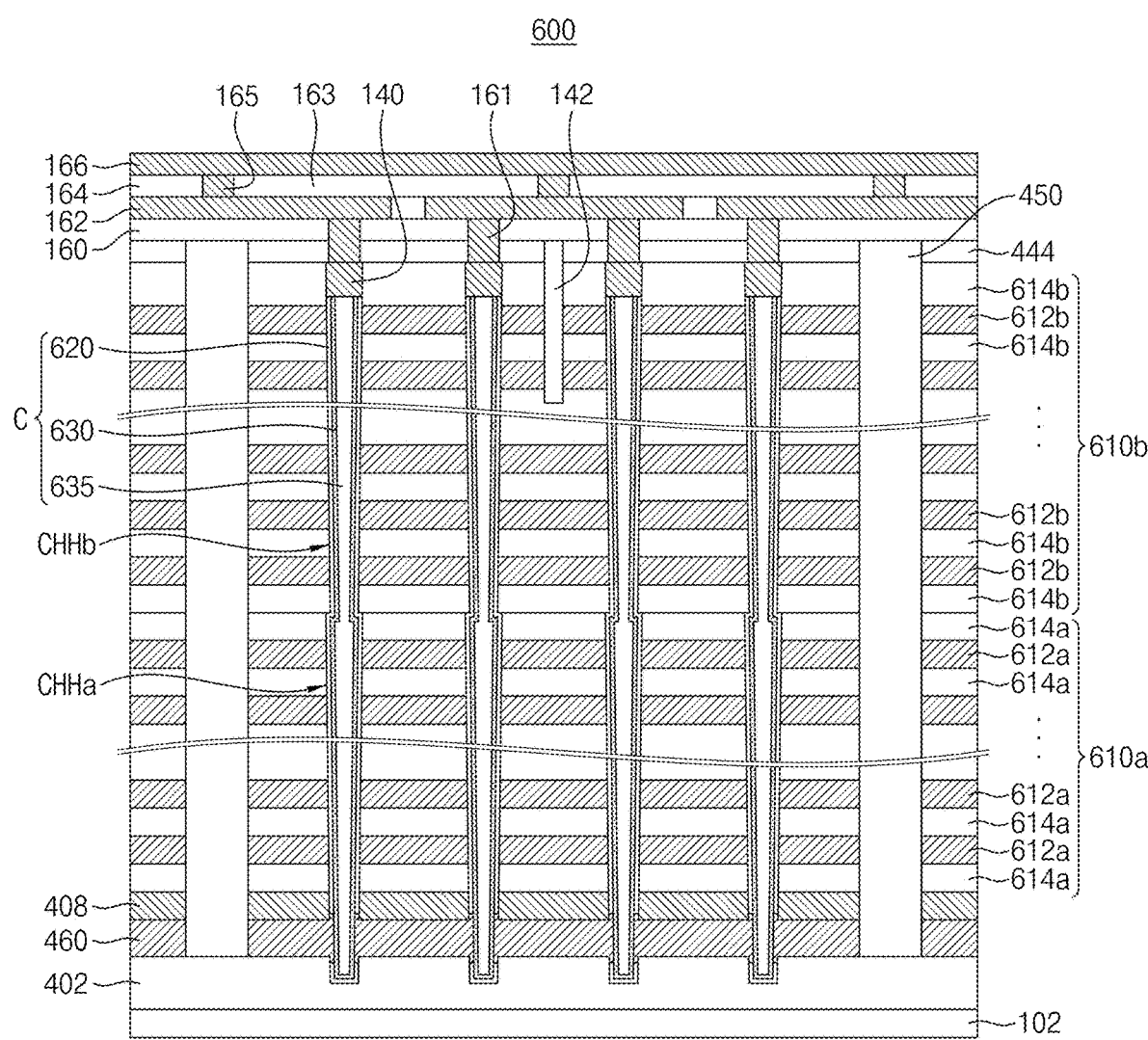
FIG. 31 is a vertical cross-sectional view of the semiconductor device according to some example embodiments of inventive concepts.

FIG. 31 is a vertical cross-sectional view of the semiconductor device according to some example embodiments of inventive concepts.

Referring to FIG. 31, the semiconductor device 600 may include a lower stack structure 610a, an upper stack structure 610b, and a channel structure C extending through the lower stack structure 610a and the upper stack structure 610b. The semiconductor device 600 may further include a source layer 402, a conductive line 460, and a support layer 408.

The lower stack structure 610a may include a plurality of transparent conductive oxide layers 612a and a plurality of dielectric layers 614a, which are alternately stacked. The upper stack structure 610b may be stacked on the lower stack structure 610a. The upper stack structure 610b may include a plurality of transparent conductive oxide layers 612b and a plurality of dielectric layers 614b, which are alternately stacked. A lower channel hole CHHa may vertically extend through the lower stack structure 610a. An upper channel hole CHHb may vertically extend through the upper stack structure 610b, and may overlap the lower channel hole CHHa.

The channel structure C may vertically extend through the lower stack structure 610a and the upper stack structure 610b. For example, the channel structure C may be disposed in the lower channel hole CHHa and the upper channel hole CHHb. The horizontal width of the upper end of the lower channel hole CHHa may be larger than the horizontal width of the lower end of the upper channel hole CHHb. The side surface of the channel structure C may have a step at a point at which the lower stack structure 610a and the upper stack structure 610b join. The channel structure C may include an information storage layer 620, a channel layer 630, and a buried dielectric layer 635.

Figure 32:
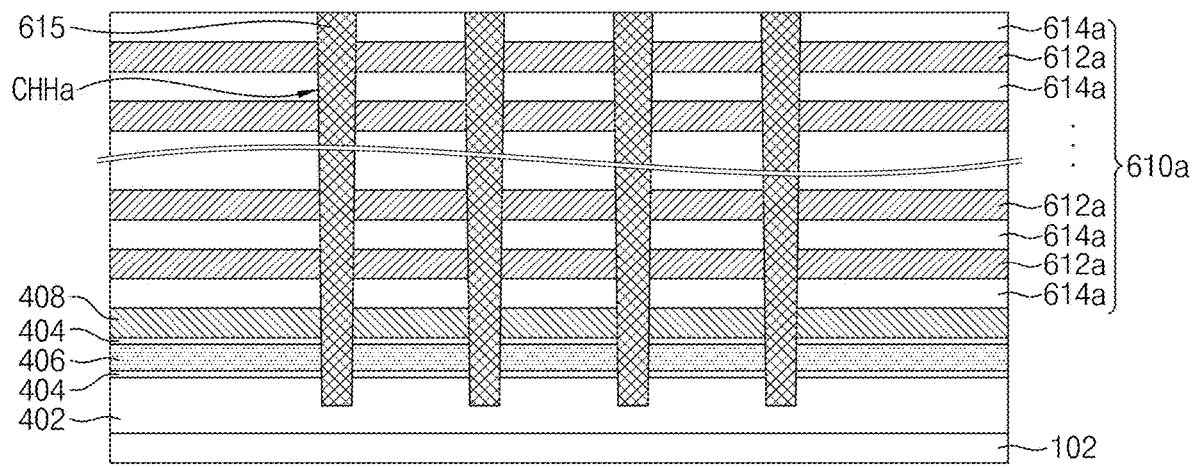
FIGS. 32-34 are vertical cross-sectional views illustrating in a process order of a method of manufacturing a semiconductor device according to some example embodiments of inventive concepts.
Figure 33:
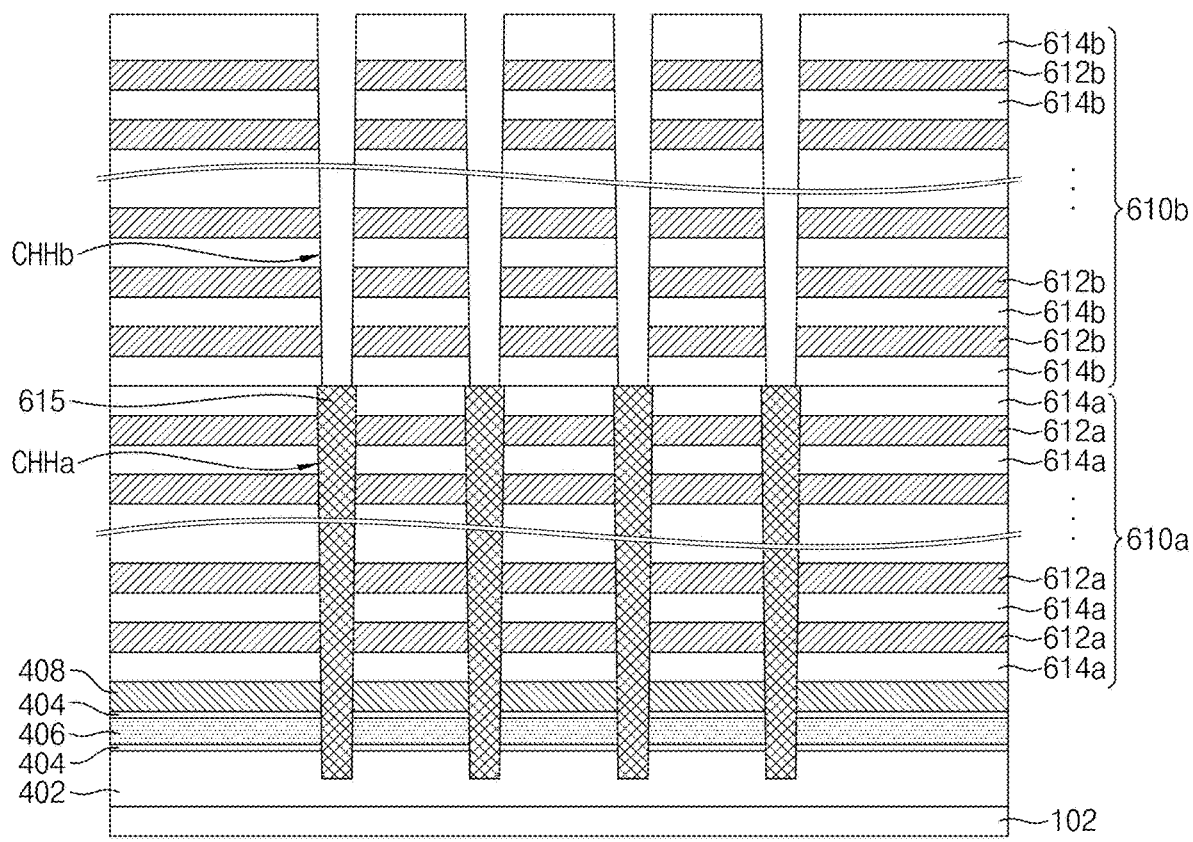
Figure 34:
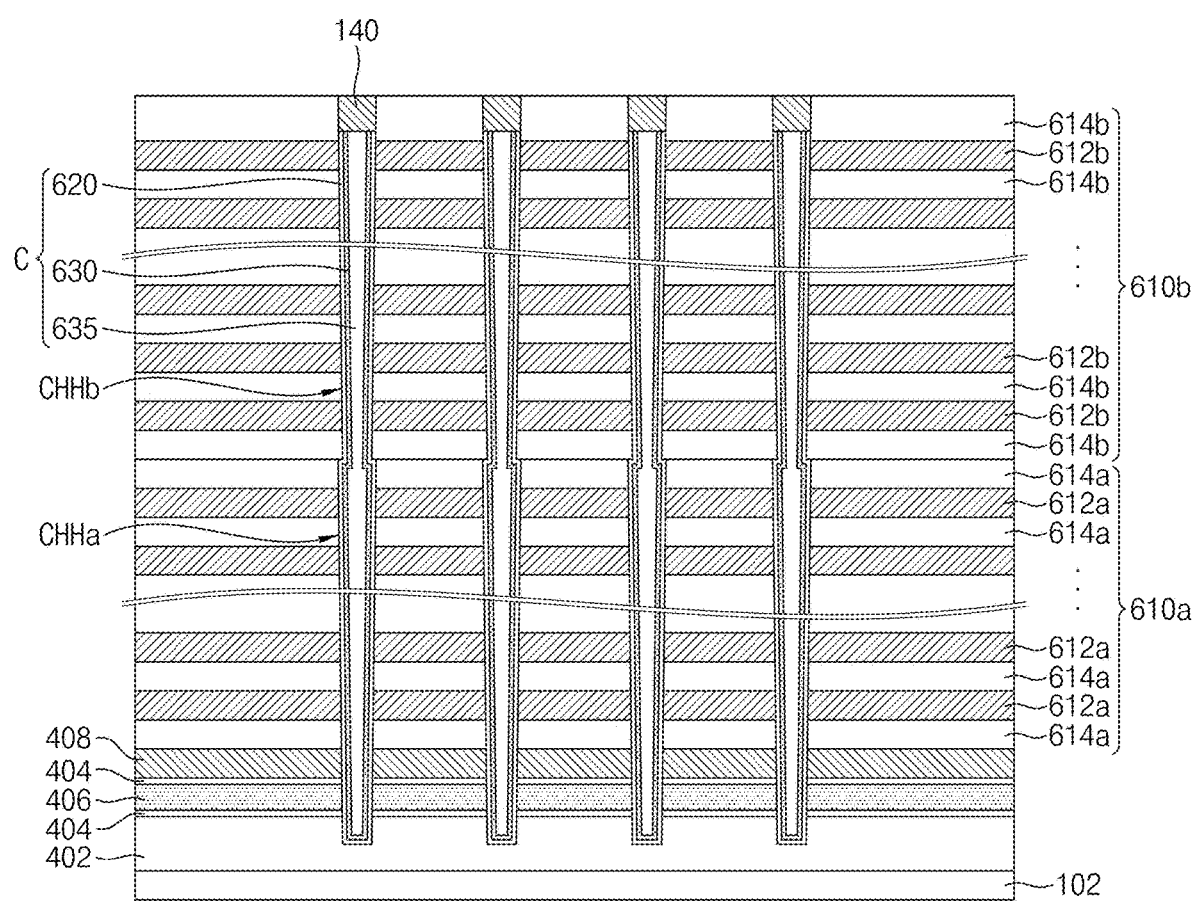

FIGS. 32-34 are vertical cross-sectional views illustrating in a process order of a method of manufacturing a semiconductor device according to some example embodiments of inventive concepts.

Referring to FIG. 32, a source layer 402, a sacrificial layer 406, and a support layer 408 may be provided on a substrate 102. Passivation layers 404 may be disposed at the upper surface and the lower surface of the sacrificial layer 406.

A lower stack structure 610a including a plurality of transparent conductive oxide layers 612a and a plurality of dielectric layers 614a, which are alternately stacked, may be formed on the support layer 408. A lower channel hole CHHa may vertically extend through the lower stack structure 610a, and a channel sacrificial layer 615 may be formed so as to fill the lower channel hole CHHa. The channel sacrificial layer 615 may include a metal, a metal nitride, a metal oxide, polysilicon, a silicon oxide, a silicon nitride, a silicon oxynitride, or a combination thereof. In some example embodiments, a barrier layer may be formed inside the lower channel hole CHHa so as to cover the side surface and the lower surface of the channel sacrificial layer 615.

Referring to FIG. 33, an upper stack structure 610b including a plurality of transparent conductive oxide layers 612b and a plurality of dielectric layers 614b, which are alternately stacked, may be stacked on the lower stack structure 610a. The upper stack structure 610b may be anisotropically etched to form an upper channel hole CHHb. The upper channel hole CHHb may extend vertically through the upper stack structure 610b, and may expose the upper surface of the channel sacrificial layer 615.

Referring to FIG. 34, the channel sacrificial layer 615 may be selectively removed. A channel structure C may be formed in the lower channel hole CHHa and the upper channel hole CHHb. The channel structure C may include an information storage layer 620, a channel layer 630, and a buried dielectric layer 635. The information storage layer 620 and the channel layer 630 may be formed conformally at the inner walls of the lower channel hole CHHa and the upper channel hole CHHb. The buried dielectric layer 635 may fill the interiors of the lower channel hole CHHa and the upper channel hole CHHb.

Referring back to FIG. 31, the sacrificial layer 406 and the passivation layers 404 may be removed, and a conducive line 460 may be formed. The conducive line 460 may abut the side surface of the channel layer 630. Subsequently, a buried layer 450 may be formed so as to extend through the lower stack structure 610a and the upper stack structure 610b, and a sub-bit line plug 161, a sub-bit line 163, a bit line plug 165, and a bit line 166 may be formed on the upper stack structure 610b.

Figure 35:
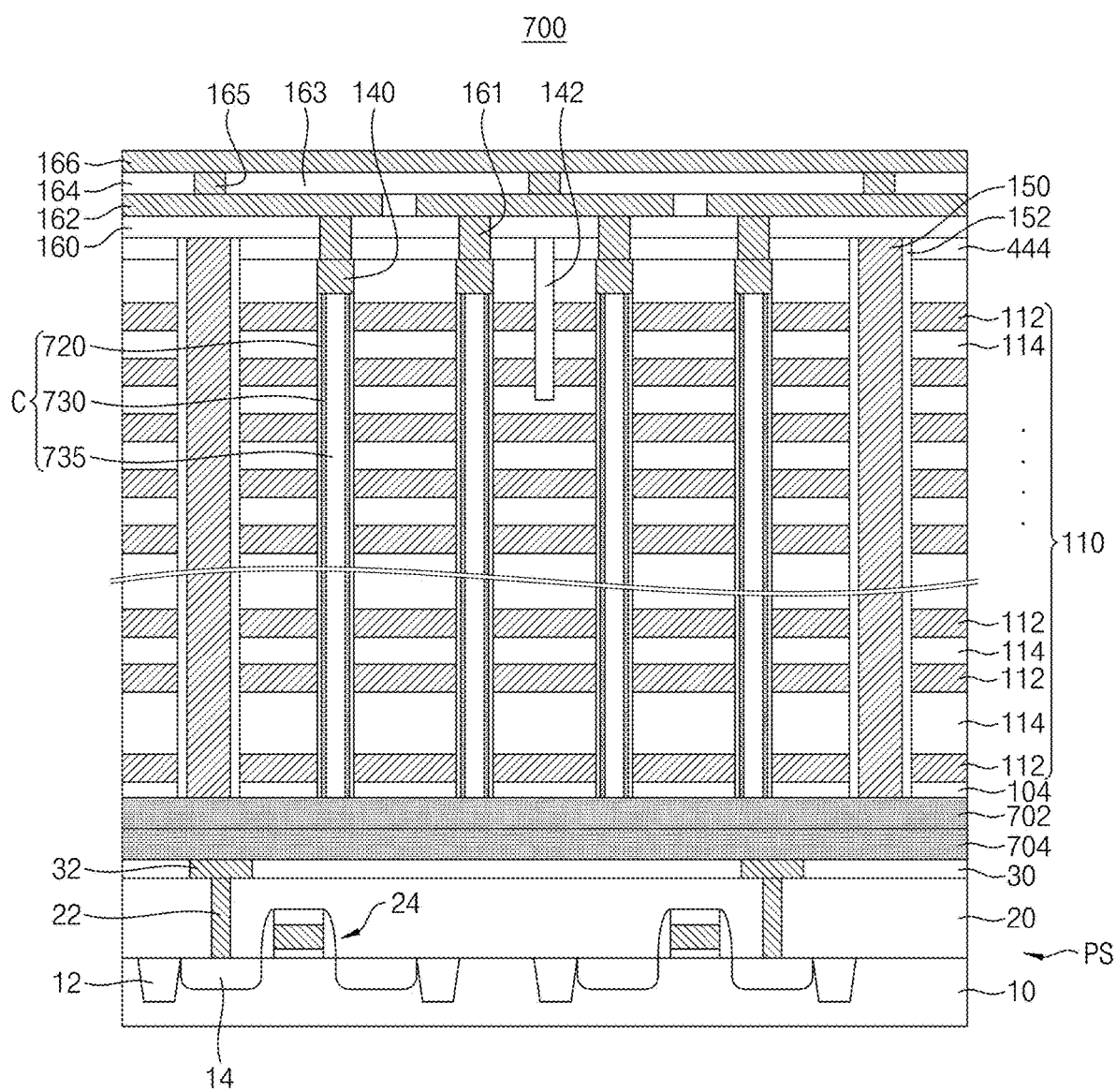
FIG. 35 is a vertical cross-sectional view of the semiconductor device according to some example embodiments of inventive concepts.

FIG. 35 is a vertical cross-sectional view of the semiconductor device according to some example embodiments of inventive concepts.

Referring to FIG. 35, the semiconductor device 700 may include an upper junction layer 702 disposed at the lower part of a stack structure 110, a lower junction layer 704 disposed on a peripheral circuit structure PS, and a channel structure C extending vertically through the stack structure 110. The lower surface of the upper junction layer 702 may abut and be electrically connected to the upper surface of the lower junction layer 704. The channel structure C may include an information storage layer 720, a channel layer 730, and a buried dielectric layer 735. The upper junction layer 702 may be connected to the channel structure C. The lower junction layer 704 may be connected to a peripheral circuit wire 32. In some example embodiments, the upper junction layer 702 and the lower junction layer 704 may be a line extending in one direction, and the upper junction layer 702 and the lower junction layer 704 may extend in different directions. The semiconductor device 700 may further include a dielectric layer formed in the upper junction layer 702 so as to extend through the upper junction layer 702. In addition, the semiconductor device 700 may further include a dielectric layer formed in the lower junction layer 704 so as to extend through the lower junction layer 704.

FIGS. 36-39 are vertical cross-sectional views illustrating in a process order of a method of manufacturing a semiconductor device according to some example embodiments of inventive concepts.

Figure 36:
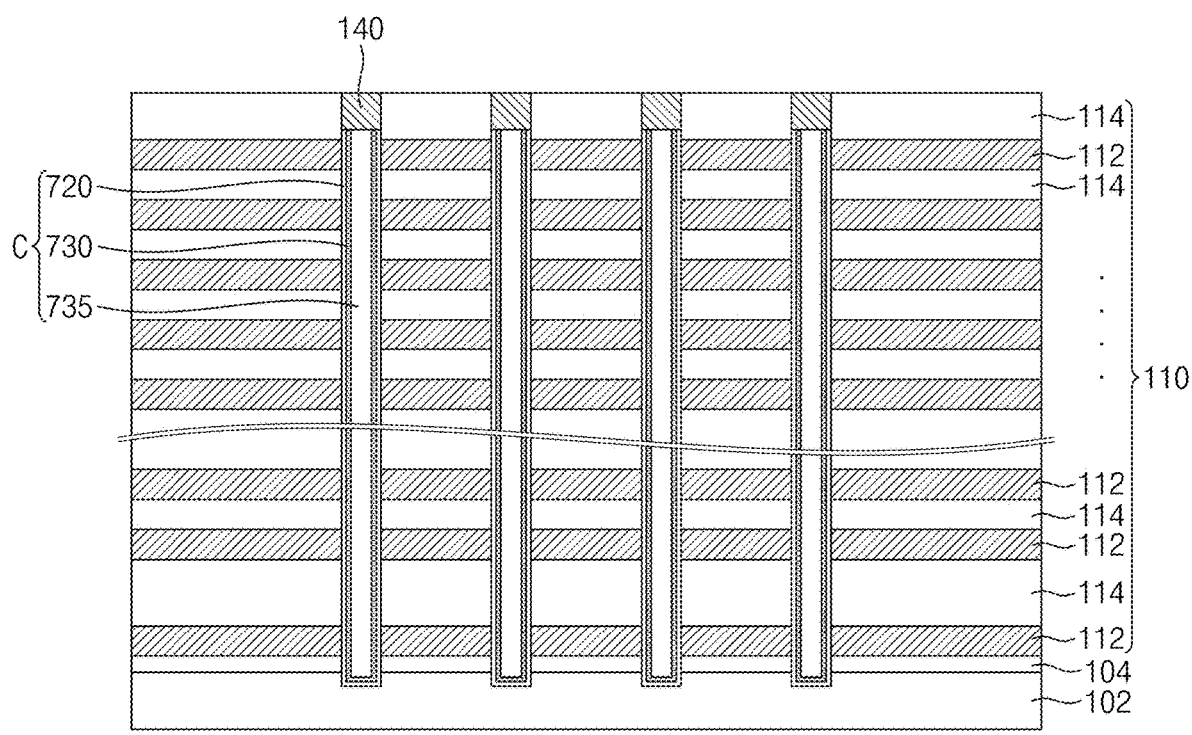
FIGS. 36-39 are vertical cross-sectional views illustrating in a process order of a method of manufacturing a semiconductor device according to some example embodiments of inventive concepts.

Referring to FIG. 36, a lower dielectric layer 104 may be formed on a substrate 102. A stack structure 110 may include a plurality of transparent conductive oxide layers 112 and a plurality of dielectric layers 114, which are alternately stacked, and may be formed on the lower dielectric layer 104. A channel structure C may be formed so as to extend vertically through a portion of the substrate 102, the lower dielectric layer 104, and the stack structure 110. The channel structure C may include an information storage layer 720, a channel layer 730, and a buried dielectric layer 735, and the lower surface of the channel structure C may be located at a lower level than the upper surface of the substrate 102. A conductive pad 140 may be formed at the upper surface of the channel structure C.

Figure 37:
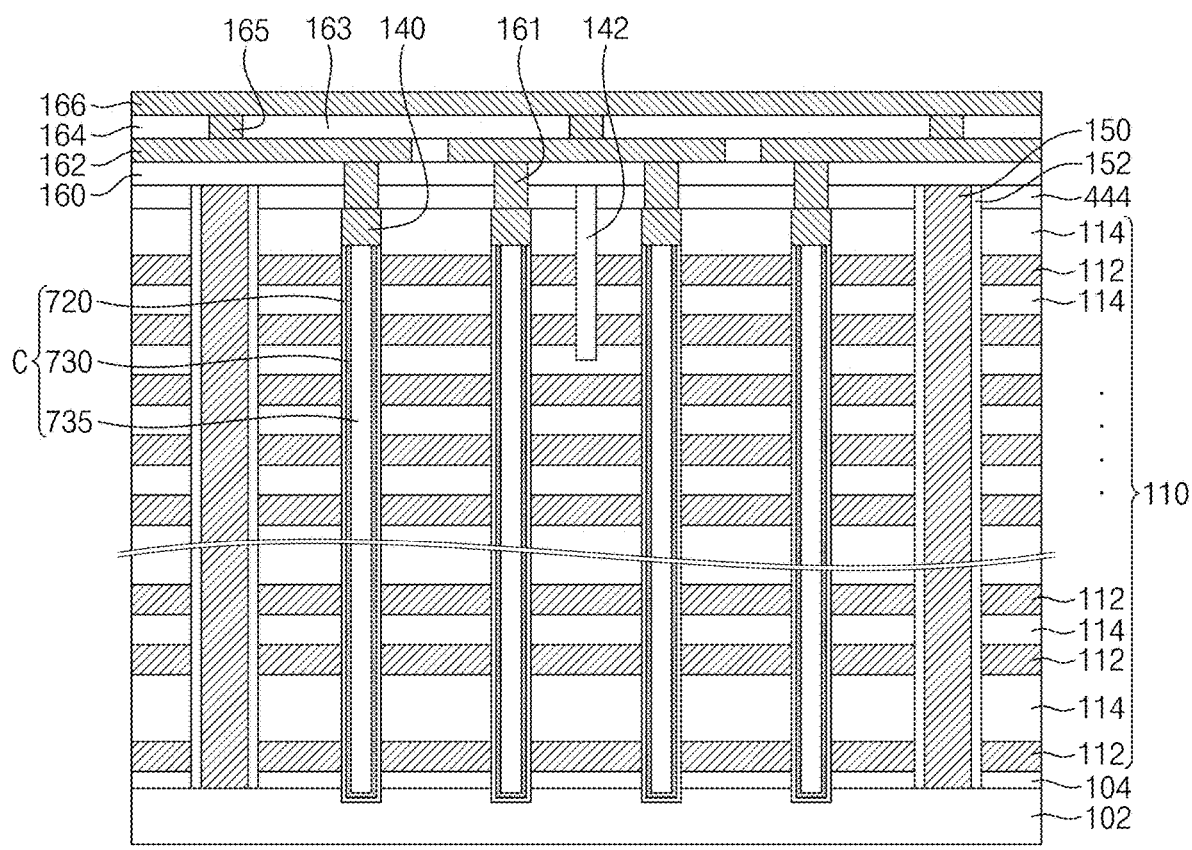

Referring to FIG. 37, a buried layer 150 may be formed adjacent to the channel structure C. The buried layer 150 may extend vertically through the stack structure 110, and a side spacer 152 may be formed at the side surface of the buried layer 150. A sub-bit line plug 161, a sub-bit line 163, a bit line plug 165, and a bit line 166 may be formed on the stack structure 110.

Figure 38:
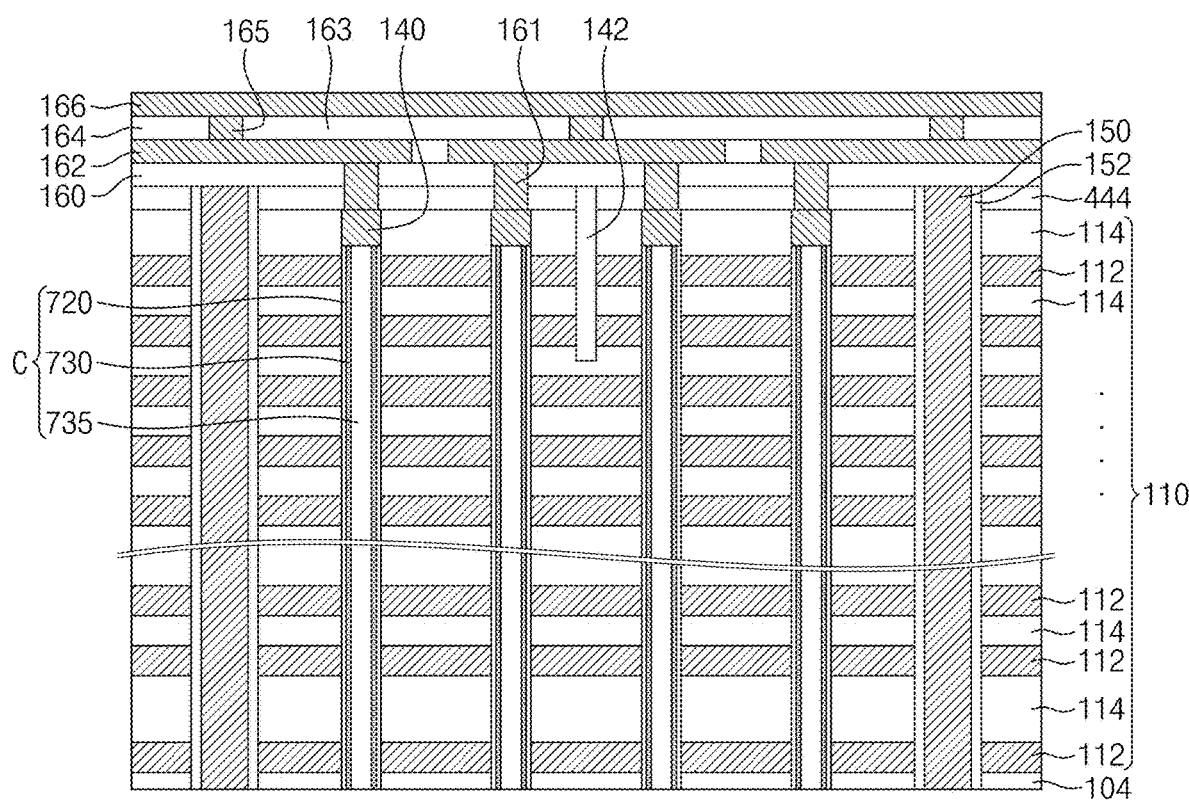

Referring to FIG. 38, the substrate 102 may be removed. In some example embodiments, a carrier may be formed on the bit line 166, the substrate 102 may be turned over such that the lower surface of the substrate 102 faces upwards, and the substrate 102 may be removed. The substrate 102 may be removed through a planarization process, such as a chemical mechanical polishing process. In the process of removing the substrate 102, a portion of the lower part of the channel structure C may be removed, and the channel layer 730 may be exposed. The information storage layer 720, the channel layer 730, and the buried dielectric layer 735 may be coplanar with the lower surface of the lower dielectric layer 104.

Figure 39:
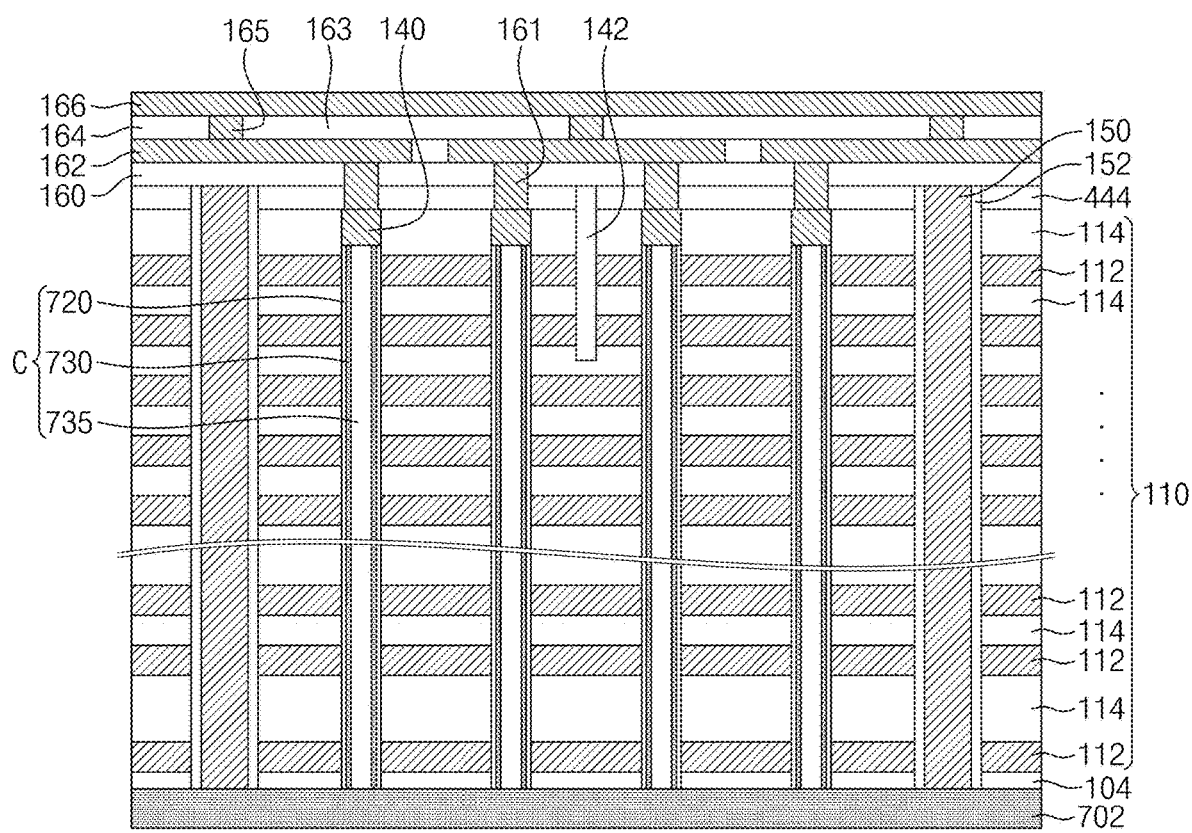

Referring to FIG. 39, an upper junction layer 702 may be formed so as to cover exposed portions of the lower dielectric layer 104, the buried layer 150, the information storage layer 720, the channel layer 730, and the buried dielectric layer 735. The upper junction layer 702 may include a semiconductor material, such as polysilicon, and/or a metal material.

Referring back to FIG. 35, the lower junction layer 704 formed on the peripheral circuit structure PS may be joined to the upper junction layer 702. The lower junction layer 704 may include the same material as the upper junction layer 702. The channel layer 730 may be electrically connected to the peripheral circuit wire 32 of the peripheral circuit structure PS via the upper junction layer 702 and the lower junction layer 704.

As is apparent from the above description, according to example embodiments of the present disclosure, a transparent conductive oxide layer may be used in a stack structure, whereby a manufacturing process may be simplified and production cost may be reduced.

While example embodiments of inventive concepts have been described with reference to the accompanying drawings, it should be understood by those skilled in the art that various modifications may be made without departing from the scope of inventive concepts and without changing essential features thereof. Therefore, the above-described embodiments should be considered in a descriptive sense only and not for purposes of limitation.

What is claimed is:

1. A semiconductor device comprising:
a stack structure on a substrate, the stack structure including a plurality of dielectric layers and a plurality of transparent conductive oxide layers, the dielectric layers and the transparent conductive oxide layers are alternately stacked, each of the dielectric layers and a corresponding one of the transparent conductive oxide layers adjacent to each other in a vertical direction have equal horizontal widths; and
a channel structure extending through the stack structure, the channel structure including
an information storage layer,
a channel layer inside the information storage layer, and
a buried dielectric layer inside the channel layer,
wherein each of the transparent conductive oxide layers is an n-type electrode.

2. The semiconductor device according to claim 1, wherein each of the transparent conductive oxide layers includes one selected from among ZnO, $SnO_2$, $TiO_2$, $CuAlO_2$, $CuGaO_2$, $CuInO_2$, and $SrCu_2O_2$.

3. The semiconductor device according to claim 1, wherein each of the transparent conductive oxide layers has a carrier concentration of $10^{17}/cm^3$ to $10^{22}/cm^3$.

4. The semiconductor device according to claim 1, wherein, in each of the dielectric layers and the corresponding transparent conductive oxide layer that are stacked adjacent to each other in the vertical direction, a central portion and an edge of the dielectric layer abut the corresponding transparent conductive oxide layer.

5. The semiconductor device according to claim 1, wherein a horizontal distance between the dielectric layers that are adjacent to each other in a horizontal direction is equal to a horizontal distance between the transparent conductive oxide layers that are adjacent to each other in the horizontal direction.

6. The semiconductor device according to claim 1, further comprising:
a lower semiconductor layer protruding vertically from an upper surface of the substrate, the lower semiconductor layer abutting a lower surface of the channel layer.

7. The semiconductor device according to claim 6, wherein an upper surface of the lower semiconductor layer is located at a lower level than a lower surface of a lowermost one of the transparent conductive oxide layers.

8. The semiconductor device according to claim 6, wherein an upper surface of the lower semiconductor layer is located at a higher level than an upper surface of a lowermost one of the transparent conductive oxide layers.

9. The semiconductor device according to claim 6, wherein a lower surface of the information storage layer is located at a lower level than the upper surface of the substrate.

10. A semiconductor device comprising:
a peripheral circuit structure including a peripheral circuit device and a contact plug;
a lower conductive layer on the peripheral circuit structure;
a stack structure on the lower conductive layer, the stack structure including a plurality of dielectric layers and a plurality of transparent conductive oxide layers, the dielectric layers and the transparent conductive oxide layers are alternately stacked; and
a plurality of channel structures extending through the stack structure, each channel structure including an information storage layer, a channel layer inside the information storage layer, the channel layer being connected to the lower conductive layer, and a buried dielectric layer inside the channel layer,
wherein each of the transparent conductive oxide layers is an n-type electrode.

11. The semiconductor device according to claim 10, wherein each of the transparent conductive oxide layers includes one selected from among ZnO, $SnO_2$, $TiO_2$, $CuAlO_2$, $CuGaO_2$, $CuInO_2$, and $SrCu_2O_2$.

12. The semiconductor device according to claim 10, wherein the lower conductive layer includes an identical material to each of the transparent conductive oxide layers.

13. The semiconductor device according to claim 10, wherein the channel layer extends through a lower surface of the information storage layer.

14. The semiconductor device according to claim 10, wherein the channel layer fills a recess in an upper surface of the lower conductive layer.

15. The semiconductor device according to claim 10, wherein a lower surface of the information storage layer is at a lower level than an upper surface of the lower conductive layer.

16. The semiconductor device according to claim 10, wherein, in a longitudinal sectional view, horizontal widths of each of the dielectric layers and a corresponding one of the transparent conductive oxide layers that are stacked adjacent to each other in a vertical direction are equal to each other.

17. A semiconductor device comprising:
a peripheral circuit structure including a peripheral circuit device and a contact plug;
a lower conductive layer on the peripheral circuit structure;
a stack structure on the lower conductive layer, the stack structure including a plurality of dielectric layers and a plurality of transparent conductive oxide layers, the dielectric layers and the transparent conductive oxide layers are alternately stacked;
a plurality of channel structures extending through the stack structure, each channel structure including an information storage layer, a channel layer inside the information storage layer, the channel layer being connected to the lower conductive layer, and a buried dielectric layer inside the channel layer;
a plurality of conductive pads in the stack structure and on respective channel structures;

a selection line separation layer extending into the stack structure separating at least one of the transparent conductive oxide layers;

a buried layer adjacent to the channel structures, the buried layer extending through the stack structure; and a bit line on the stack structure, the bit line being electrically connected to the conductive pads, wherein when viewed in a longitudinal sectional view, horizontal widths of each of the dielectric layers and a corresponding one of the transparent conductive oxide layers that are stacked adjacent to each other in a vertical direction are substantially equal to each other, in each of the dielectric layers and the corresponding one of the transparent conductive oxide layers that are stacked adjacent to each other in the vertical direction, a central portion and an edge of the dielectric layer abut the transparent conductive oxide layer, and a horizontal distance between dielectric layers that are adjacent to each other in a horizontal direction, among the dielectric layers, is substantially equal to a horizontal distance between transparent conductive oxide layers that are adjacent to each other in the horizontal direction, among the transparent conductive oxide layers, and wherein each of the transparent conductive oxide layers is an n-type electrode.

18. The semiconductor device according to claim 17, wherein the lower conductive layer includes an identical material to each of the transparent conductive oxide layer.

* * * * *